(12) United States Patent
Cheng et al.

(10) Patent No.: US 12,100,745 B2
(45) Date of Patent: *Sep. 24, 2024

(54) DUAL METAL CAPPED VIA CONTACT STRUCTURES FOR SEMICONDUCTOR DEVICES

(71) Applicant: Taiwan Semiconductor Manufacturing Co., Ltd., Hsinchu (TW)

(72) Inventors: Chung-Liang Cheng, Changhua (TW); Ziwei Fang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/305,636

(22) Filed: Apr. 24, 2023

(65) Prior Publication Data

US 2023/0261070 A1 Aug. 17, 2023

Related U.S. Application Data

(60) Division of application No. 17/190,236, filed on Mar. 2, 2021, now Pat. No. 11,670,694, which is a
(Continued)

(51) Int. Cl.
*H01L 29/76* (2006.01)
*H01L 21/8234* (2006.01)
(Continued)

(52) U.S. Cl.
CPC ............ *H01L 29/41791* (2013.01); *H01L 21/823431* (2013.01); *H01L 21/823475* (2013.01); *H01L 29/7851* (2013.01); *H01L 27/0886* (2013.01)

(58) Field of Classification Search
CPC ....... H01L 29/41791; H01L 21/823431; H01L 21/823475; H01L 29/7851; H01L 27/0886;
(Continued)

(56) References Cited

U.S. PATENT DOCUMENTS 8,519,475 B2 8/2013 Masuoka et al.
9,093,530 B2 7/2015 Huang et al.
(Continued)

*Primary Examiner* — Theresa T Doan
(74) *Attorney, Agent, or Firm* — Sterne, Kessler, Goldstein & Fox P.L.L.C.

(57) ABSTRACT

The structure of a semiconductor device with dual metal capped via contact structures and a method of fabricating the semiconductor device are disclosed. A method of fabricating the semiconductor device includes forming a source/drain (S/D) region and a gate structure on a fin structure, forming S/D and gate contact structures on the S/D region and the gate structure, respectively, forming first and second via contact structures on the S/D and gate contact structures, respectively, and forming first and second interconnect structures on the first and second via contact structures, respectively. The forming of the first and second via contact structures includes forming a first via contact plug interposed between first top and bottom metal capping layers and a second via contact plug interposed between second top and bottom metal capping layers, respectively.

20 Claims, 13 Drawing Sheets

Related U.S. Application Data continuation of application No. 16/692,127, filed on Nov. 22, 2019, now Pat. No. 10,964,792.

(51) Int. Cl.
*H01L 29/417* (2006.01)
*H01L 29/78* (2006.01)
*H01L 29/94* (2006.01)
*H01L 27/088* (2006.01)

(58) Field of Classification Search
CPC ......... H01L 21/28518; H01L 21/76843; H01L 21/76855; H01L 21/76883; H01L 21/76805; H01L 21/76849; H01L 23/485; H01L 29/66795; H01L 29/785
USPC ....................................................... 257/401
See application file for complete search history.

(56) References Cited

U.S. PATENT DOCUMENTS

| | | | |
|---|---|---|---|
| 9,105,490 B2 | 8/2015 | Wang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,425,105 B1 | 8/2016 | Basker et al. | |
| 9,443,769 B2 | 9/2016 | Wang et al. | |
| 9,455,227 B1 | 9/2016 | Hung et al. | |
| 9,520,482 B1 | 12/2016 | Chang et al. | |
| 9,548,303 B2 | 1/2017 | Lee et al. | |
| 9,548,366 B1 | 1/2017 | Ho et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,722,030 B1 | 8/2017 | Hsieh et al. | |
| 9,831,183 B2 | 11/2017 | Lin et al. | |
| 9,859,386 B2 | 1/2018 | Ho et al. | |
| 10,964,792 B1 * | 3/2021 | Cheng | H01L 21/823431 |
| 2007/0099414 A1 | 5/2007 | Frohberg et al. | |
| 2009/0101968 A1 | 4/2009 | Sugioka et al. | |
| 2014/0027822 A1 | 1/2014 | Su et al. | |
| 2014/0327140 A1 | 11/2014 | Zhang et al. | |
| 2015/0091067 A1 | 4/2015 | Pillarisetty et al. | |
| 2015/0262864 A1 | 9/2015 | Okamoto et al. | |
| 2016/0126190 A1 | 5/2016 | Zhang et al. | |
| 2016/0141243 A1 | 5/2016 | You et al. | |
| 2017/0040318 A1 | 2/2017 | Hung et al. | |
| 2017/0154823 A1 | 6/2017 | Tseng et al. | |
| 2018/0033866 A1 | 2/2018 | Liao et al. | |
| 2018/0174904 A1 | 6/2018 | Hsieh et al. | |
| 2018/0286959 A1 | 10/2018 | Wang et al. | |
| 2018/0294184 A1 | 10/2018 | Koh et al. | |
| 2018/0301371 A1 | 10/2018 | Wang et al. | |
| 2018/0315652 A1 | 11/2018 | Tsai et al. | |
| 2018/0337188 A1 | 11/2018 | Yu et al. | |
| 2019/0172752 A1 | 6/2019 | Hsu et al. | |
| 2019/0334008 A1 | 10/2019 | Chen et al. | |
| 2019/0348511 A1 | 11/2019 | Karpov et al. | |
| 2019/0363180 A1 | 11/2019 | Zang et al. | |
| 2020/0006127 A1 | 1/2020 | Khaderbad et al. | |
| 2020/0044025 A1 | 2/2020 | Liu et al. | |
| 2020/0135641 A1 | 4/2020 | Lee et al. | |
| 2020/0235008 A1 | 7/2020 | Wu et al. | |

\* cited by examiner

DUAL METAL CAPPED VIA CONTACT STRUCTURES FOR SEMICONDUCTOR DEVICES

CROSS-REFERENCE TO RELATED APPLICATION

This application is a divisional application of U.S. patent application Ser. No. 17/190,236, titled "Dual Metal Capped Via Contact Structures For Semiconductor Devices," filed on Mar. 2, 2021, which is a continuation application of U.S. patent application Ser. No. 16/692,127, titled "Dual Metal Capped Via Contact Structures For Semiconductor Devices," filed on Nov. 22, 2019, now U.S. Pat. No. 10,964,792, all of which are incorporated herein by reference in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
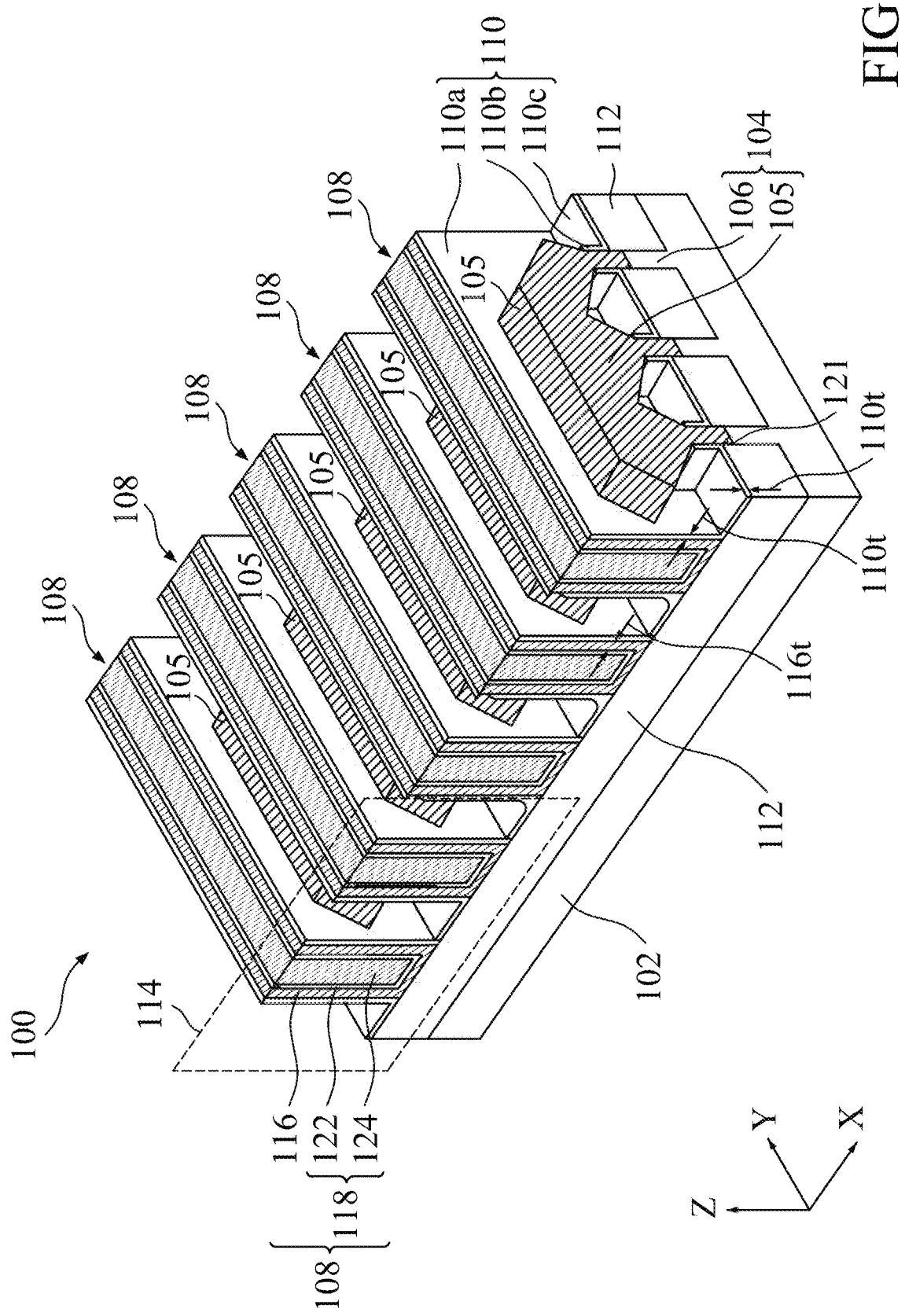
FIG. 1 illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "deposition selectivity" refers to the ratio of the deposition rates on two different materials or surfaces under the same deposition conditions.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "vertical" means nominally perpendicular to the surface of a substrate.

In some embodiments, the terms "about" and "substantially" can indicate a value of a given quantity that varies within 5% of the value (e.g., ±1%, ±2%, ±3%, ±4%, ±5% of the value).

The fin structures discloses herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example via contact structures with dual metal capping layers (also referred to as dual metal capped via contact structures) in field effect transistors (FET) devices (e.g., finFETs, gate-all-around FETs, MOSFETs, etc.) and/or other semiconductor devices in an integrated circuit (IC) and example methods for fabricating the same. The dual metal capped via contact structures on source/drain and/or gate contact structures can reduce the contact resistance between semiconductor devices and interconnect structures (e.g., conductive lines, vias structures, etc.), thus resulting in improved device performance compared to semiconductor devices without dual metal capped via contact structures. The upper metal capping layers (e.g., tungsten (W) capping layers) of the dual metal capping layers can reduce electromigration of materials (e.g., copper (Cu)) from interconnect structures overlying the via contact structures and improve yield of the semiconductor devices. The bottom metal capping layers (e.g., tungsten (W) capping layers) of the dual metal capping layers can prevent corrosions of underlying source/drain and/or gate contact structures during subsequent processes.

The scaling down of FET devices has increased the complexity of fabricating via contact structures with low resistivity in via contact openings with dimensions (e.g., width or diameter) less than about 20 nm. The resistance of tungsten (W) via contact structures with liners as adhesion layer can be high for via contact structures with such small dimensions. One of the challenges of fabricating via contact structures with such small dimensions can be the fabrication of void-free via contact structures. The presence of voids in via contact structures can increase their resistivity, and as a result increase the contact resistance between the semiconductor devices and interconnect structures.

The example structures and methods disclosed herein provide substantially void-free (e.g., with no voids) dual metal capped via contact structures. The substantially void-free dual metal capped via contact structures can be formed with low resistivity in via contact openings with dimensions (e.g., width or diameter) less than about 20 nm and with high aspect ratio (e.g., about 5 to about 8). The aspect ratio of the via contact openings can be a ratio of their vertical dimensions (e.g., height) to their horizontal dimensions (e.g., width or diameter).

In some embodiments, the dual metal capped via contact structures can include via contact plugs having one or more metal layers of low resistivity metals, such as ruthenium (Ru), iridium (Ir), nickel (Ni), Osmium (Os), rhodium (Rh), aluminum (Al), molybdenum (Mo), tungsten (W), or cobalt (Co), and/or other suitable low resistivity metals, and top and bottom metal capping layers disposed on top and bottom surfaces of the via contact plugs, where the top and bottom metal capping layers include low resistivity metals different from the via contact plugs. In some embodiments, dual metal capped via contact structures with Ru-based via contact plugs, with dimensions ranging from about 10 nm to about 15 nm, and with aspect ratios ranging from about 5 to about 8 has lower resistivity compared to via contact structures with Cu, W, or Co-based via contact plugs and similar dimensions. In some embodiments, the Ru-based dual metal capped via contact structures can reduce via contact resistance by about 10% to about 30% compared to W, Cu, or Co-based via contact structures with similar dimensions.

In some embodiments, the dual metal capped via contact structures can be formed without metal-based barrier layers (also referred to as adhesion layers or liners) along the sidewalls of via contact openings. As the metal(s) of the via contact plugs can have lower resistivity than the metal-based barrier layers, the resistance of the via contact structures can be reduced without the metal-based barrier layers.

Though the present disclosure describes the dual metal capped via contact structures on source/drain (S/D) and/or gate contact structures of a finFET, the dual metal capped via contact structures and the methods for forming these structures described herein can be applied to other FETs and other semiconductor devices, such as gate-all-around (GAA) FETs, MOSFETs, high resistance resistors, or passive devices.

FIG. 1 illustrates an isometric view of a semiconductor device 100, according to some embodiments. The isometric view of semiconductor device 100 is shown for illustration purposes and may not be drawn to scale. Semiconductor device 100 can be formed on a substrate 102 and can include fin structures 104, gate structures 108 disposed on fin structures 104, spacers 110 disposed on opposite sides of gate structures 108, and shallow trench isolation (STI) regions 112. Though FIG. 1 shows five gate structures 108, semiconductor device 100 can include one or more gate structures similar and parallel to gate structures 108.

Substrate 102 can be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structures 104 represent current carrying structures of semiconductor device 100 and can traverse along an X-axis and through gate structures 108. Fin structures 104 can include: (i) epitaxial fin regions 105 disposed on opposing sides of gate structures 108; and (ii) fin regions 106 underlying epitaxial fin regions 105 and gate structures 108. Epitaxial fin regions 105 can form source/drain (S/D)

regions of semiconductor device 100 and the portions of fin regions 106 underlying gate structures 108 can form the channel regions (not shown) of semiconductor device 100. Fin regions 106 can be formed from patterned portions of substrate 102 and form interfaces 121 with epitaxial fin regions 105. In some embodiments, interfaces 121 can be coplanar with top surface of STI regions 112 or top surface of substrate 102. Though semiconductor device 100 is shown to have merged epitaxial fin region 105 on three fin regions 106, semiconductor device 100 can have an individual epitaxial fin region similar in composition to epitaxial fin region 105 on each fin region 106.

Each of epitaxial fin regions 105 can include an epitaxially-grown semiconductor material. In some embodiments, the epitaxially grown semiconductor material is the same material as the material of substrate 102. In some embodiments, the epitaxially-grown semiconductor material can include a different material from the material of substrate 102. The epitaxially-grown semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide.

In some embodiments, epitaxial fin regions 105 can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 105 can be grown by an epitaxial deposition/partial etch process, which repeats the epitaxial deposition/partial etch process at least once. Such repeated deposition/partial etch process is also called a cyclic deposition-etch (CDE) process. In some embodiments, epitaxial fin regions 105 can be grown by selective epitaxial growth (SEG), where an etching gas is added to promote the selective growth of semiconductor material on the exposed surfaces of fin regions 106, but not on insulating material (e.g., dielectric material of STI regions 112).

Each of epitaxial fin regions 105 can be p-type or n-type. Each of p-type epitaxial fin regions 105 can include SiGe, Si, silicon germanium bromide (SiGeB), Ge or III-V materials (e.g., indium antimonide (InSb), gallium antimonide (GaSb), or indium gallium antimonide (InGaSb)) and can be in-situ doped during an epitaxial growth process using p-type dopants, such as boron, indium, or gallium. For p-type in-situ doping, p-type doping precursors, such as diborane ($B_2H_6$), boron trifluoride ($BF_3$), and/or other p-type doping precursors, can be used.

Each of p-type epitaxial fin regions 105 can include epitaxially grown p-type first, second, and third sub-regions (not shown), where the third sub-region can be grown on the second sub-region, and the second sub-region can be grown on the first sub-region. In some embodiments, the sub-regions can have SiGe and differ from each other based on, for example, doping concentration, epitaxial growth process conditions, and/or relative concentration of Ge with respect to Si. For example, the atomic percent Ge in the first sub-region can be less than the atomic percent Ge in the second sub-region and greater than the atomic percent Ge in third sub-region. In some embodiments, the atomic percent Ge in the first sub-region can be equal to the atomic percent Ge in the second sub-region, but greater than the atomic percent Ge in the third sub-region. In some embodiments, the first sub-region can include Ge in a range from about 15 atomic percent to about 35 atomic percent, while the second sub-region can include Ge in a range from about 35 atomic percent to about 70 atomic percent and the third sub-region can include less than about 25 atomic percent Ge with any remaining atomic percent being Si in the sub-regions.

The sub-regions can be epitaxially grown under a pressure of about 10 Torr to about 300 Torr, at a temperature from about 500° C. to about 700° C. using reaction gases, such as HCl as an etching agent, $GeH_4$ as Ge precursor, dichlorosilane (DCS) and/or $SiH_4$ as Si precursor, $B_2H_6$ as B dopant precursor, $H_2$, and/or $N_2$. To achieve different concentration of Ge in the sub-regions, the ratio of a flow rate of Ge to Si precursors may be varied during their respective growth process. For example, a Ge to Si precursor flow rate ratio in a range from about 9 to about 25 can be used during the epitaxial growth of the second sub-region, while a Ge to Si precursor flow rate ratio less than about 6 can be used during the epitaxial growth of the third sub-region.

The sub-regions can have varying dopant concentration with respect to each other. For example, the first sub-region can be undoped or can have a dopant concentration lower than the dopant concentrations of the second and third sub-regions. In some embodiments, the first sub-region can have a dopant concentration less than about $5 \times 10^{20}$ atoms/$cm^3$, while the second sub-region can have a dopant concentration in a range from about $1 \times 10^{20}$ to about $2 \times 10^{21}$ atoms/$cm^3$ and the third sub-region can have a dopant concentration in a range from about $1 \times 10^{20}$ to about $3 \times 10^{21}$ atoms/$cm^3$.

In some embodiments, each of n-type epitaxial fin regions 105 can include Si, silicon phosphide (SiP), silicon carbide (SiC), silicon phosphorus carbide (SiPC), or III-V materials (e.g., indium phosphide (InP), gallium arsenide (GaAs), aluminum arsenide (AlAs), indium arsenide (InAs), indium aluminum arsenide (InAlAs), or indium gallium arsenide (InGaAs)) and can be in-situ doped during an epitaxial growth process using n-type dopants, such as phosphorus or arsenic. For n-type in-situ doping, n-type doping precursors, such as phosphine ($PH_3$), arsine ($AsH_3$), and/or other n-type doping precursor, can be used. Each of epitaxial fin regions 105 can have multiple n-type sub-regions. Except for the type of dopants, the n-type sub-regions can be similar to the p-type sub-regions, in thickness, dopant concentration, and/or epitaxial growth process conditions. Other materials, thicknesses, and dopant concentrations for the n-type and/or p-type sub-regions are within the scope and spirit of this disclosure.

Gate structures 108 can include a gate dielectric layer 116 and a gate electrode 118 disposed on gate dielectric layer 116. Gate structures 108 can be formed by a gate replacement process.

In some embodiments, gate dielectric layer 116 can have a thickness 116t in a range from about 1 nm to about 5 nm. Gate dielectric layer 116 can include silicon oxide and can be formed by CVD, atomic layer deposition (ALD), physical vapor deposition (PVD), e-beam evaporation, or other suitable processes. In some embodiments, gate dielectric layer 116 can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, gate dielectric layer 116 can include a single layer or a stack of insulating material layers. Other materials and formation methods for gate dielectric layers 116 are within the scope and spirit of this disclosure.

In some embodiments, gate electrode 118 can include a gate barrier layer (not shown), a gate work function layer 122, and a gate metal fill layer 124. Gate barrier layer can serve as a nucleation layer for subsequent formation of gate work function layer 122 and/or can help to prevent substantial diffusion of metals (e.g., Al) from gate work function layer 122 to underlying layers (e.g., gate dielectric layer 116). Gate barrier layer can include titanium (Ti), tantalum (Ta), titanium nitride (TiN), tantalum nitride (TaN), or other suitable diffusion barrier materials and can be formed by ALD, PVD, CVD, or other suitable metal deposition processes. In some embodiments, gate barrier layer can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules. In some embodiments, gate barrier layer can have a thickness ranging from about 1 nm to about 10 nm. Other materials, formation methods and thicknesses for gate barrier layer are within the scope and spirit of this disclosure.

Gate work function layer 122 can include a single metal layer or a stack of metal layers. The stack of metal layers can include metals having work function values equal to or different from each other. In some embodiments, gate work function layer 122 can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, gate work function layer 122 can include Al-doped metal, such as Al-doped Ti, Al-doped TiN, Al-doped Ta, or Al-doped TaN. Gate work function layer 122 can be formed using a suitable process such as ALD, CVD, PVD, plating, or combinations thereof. In some embodiments, gate work function layer 122 can have a thickness ranging from about 2 nm to about 15 nm. Other materials, formation methods and thicknesses for gate work function layer 122 are within the scope and spirit of this disclosure.

Gate metal fill layer 124 can include a single metal layer or a stack of metal layers. The stack of metal layers can include metals different from each other. In some embodiments, gate metal fill layer 124 can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Gate metal fill layer 124 can be formed by ALD, PVD, CVD, or other suitable deposition processes. Other materials and formation methods for gate metal fill layer 124 are within the scope and spirit of this disclosure.

Each of spacers 110 can include spacer portions 110a that form sidewalls of gate structures 108 and are in contact with dielectric layer 116, spacer portions 110b that form sidewalls of fin structures 104, and spacer portions 110c that form protective layers on STI regions 112. Spacers 110 can include insulating material, such as silicon oxide, silicon nitride, a low-k material, or a combination thereof. Spacers 110 can have a low-k material with a dielectric constant less than 3.9 (e.g., less than 3.5, 3, or 2.8). In some embodiments, each of spacers 110 can have a thickness 110t in a range from about 5 nm to about 10 nm. Based on the disclosure herein, a person of ordinary skill in the art will recognize that other materials and thicknesses for spacers 110 are within the scope and spirit of this disclosure.

STI regions 112 can provide electrical isolation to semiconductor device 100 from neighboring active and passive elements (not shown) integrated with or deposited onto substrate 102. STI regions 112 can have a dielectric material, such as silicon oxide, silicon nitride, silicon oxynitride, fluorine-doped silicate glass (FSG), a low-k dielectric material, and/or other suitable insulating materials. In some embodiments, STI regions 112 can include a multi-layered structure.

Figure 2:
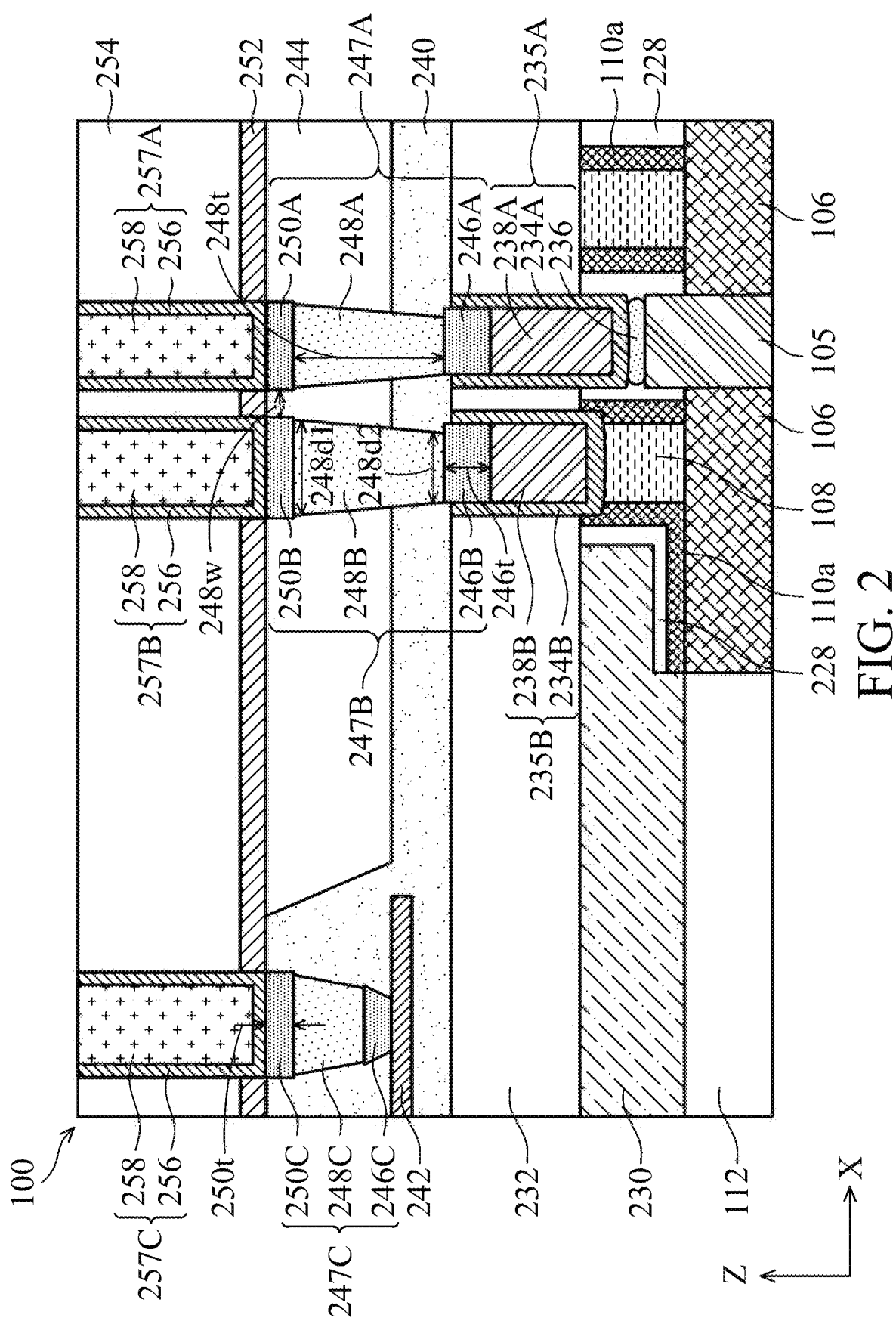
FIG. 2 illustrates a cross-sectional view of a semiconductor device, in accordance with some embodiments.

Semiconductor device 100 can include additional elements, such as etch stop layers (ESLs) 228 and 240, interlayer dielectric (ILD) layers 230, 232, and 244, S/D contact structures 235A, gate contact structures 235B, high resistance (high R) structure 242, dual metal capped via contact structures 247A-247C, and interconnect structures 257A-257C, which are illustrated and described with reference to FIG. 2. FIG. 2 is a cross-sectional view of area 114 of semiconductor device 100 in FIG. 1. The area 114 can be along an XZ plane through epitaxial fin region 105 and fin region 106 and gate structures 108 adjacent to them. These additional elements of semiconductor device 100 are not shown in FIG. 1 for the sake of clarity. Though FIG. 2 shows contact structure 235A-235B, via contact structures 247A-247B, and interconnect structures 257A-257B formed on one of fin structures 104 and gate structures 108, respectively, these structures can be similarly formed on the other fin structures 104 and gate structures 108 shown in FIG. 1.

Referring to FIG. 2, ESL 228 can be configured to protect gate structures 108 and epitaxial fin regions 105 during subsequent processing. This protection can be provided, for example, during the formation of ILD layer 232, S/D contact structures 235A, and/or gate contact structures 235B. ESL 228 can be disposed on sides of spacers 110 and on epitaxial fin regions 105. In some embodiments, ESL 228 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), silicon nitride (SiN), silicon oxycarbide (SiOC), silicon oxycarbo-nitride (SiOCN), or a combination thereof. In some embodiments, ESL 228 can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 228 can have a thickness along a Z-axis in a range from about 1 nm to about 10 nm.

ESL 240 can be similar in material composition to ESL 228, according to some embodiments. In some embodiments, ESL 240 can have a thickness along a Z-axis different from thickness of ESL 228 in a range from about 5 nm to about 10 nm. ESL 240 can be disposed on ILD layer 232, S/D contact structures 235A, and gate contact structures 235B. Other materials, formation methods, and thicknesses for ESLs 228 and 240 are within the scope and spirit of this disclosure.

ILD layer 230 can be disposed on STI regions 112 and ESL 228 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, ILD layer 230 can include silicon oxide ($SiO_2$), SiOC, zirconium oxide ($ZrO_2$), hafnium oxide ($HfO_2$), or dielectric materials with high-k, low-k (e.g., k-value in a range from about 3.9 to about 3.0), or extreme low-k (e.g., k-value in a range from about 2.9 to about 2.0). In some embodiments, ILD layer 230 can have a thickness along a Z-axis in a range from about 50 nm to about 200 nm. In some embodiments, ILD layer 230 can include a stack of dielectric layers, where each dielectric layer can have thickness along a Z-axis in a range from about 1 nm to about 10 nm.

ILD layer 232 can be disposed on ILD layer 230 and can have a thickness along a Z-axis in a range from about 100 nm to about 600 nm. ILD layer 244 can be disposed on ESL 240 and can have a thickness along a Z-axis in a range from about 100 nm to about 600 nm. In some embodiments, ILD layers 232 and 244 can be similar in material composition to ILD layer 230. In some embodiments, ILD layer 232 can include a dielectric material, such as silicon oxycarbide, TEOS oxide, or a combination thereof. In some embodiments, ILD layer 244 can include a low-k dielectric material having a k value less than about 3.0 (e.g., about 2.8 or about 2.5). Other materials, thicknesses, and formation methods for ILD layers 230, 232, and 244 are within the scope and spirit of this disclosure.

Still referring to FIG. 2, S/D contact structures 235A can be configured to electrically connect epitaxial fin regions 105 to other elements of semiconductor device 100 and/or of the integrated circuit (not shown). S/D contact structures 235A can be disposed on and in electrical contact with epitaxial fin regions 105. In some embodiments, each of S/D contact structures 235A can include (i) a silicide layer 236, (ii) a S/D contact barrier layer 234A, and (iii) a S/D contact plug 238A.

Silicide layers 236 can be disposed on or within epitaxial fin regions 105 and can have a thickness along a Z-axis in a range from about 4 nm to about 6 nm. Silicide layers 236 can provide a low resistance interface between epitaxial fin regions 105 and S/D contact plugs 238A. Silicide layers 236 can include Co, Ni, Ti, W, Mo, Ti, nickel cobalt alloy (NiCo), Pt, nickel platinum alloy (NiPt), Ir, platinum iridium alloy (PtIr), Er, Yb, Pd, Rh, niobium (Nb), titanium silicon nitride (TiSiN), other refractory metals, or a combination thereof. In some embodiments, silicide layers 236 can include a metal silicide-dopant complex material that can be formed from dopants included during the formation of silicide layers 236. Silicide layers 236 can have a dopant concentration greater than $10^{21}$ atoms/cm$^3$, $10^{22}$ atoms/cm$^3$, or $10^{23}$ atoms/cm$^3$. For n-type epitaxial fin regions 105, dopants in silicide layers 236 can include phosphorus, arsenic, other n-type dopants, or a combination thereof. For p-type epitaxial fin regions 105, dopants in silicide layers 236 can include indium (In), gallium (Ga), other p-type dopants, or a combination thereof.

S/D contact barrier layers 234A can be disposed between silicide layers 236 and S/D contact plugs 238A and along sidewalls of S/D contact plugs 238A as shown in FIG. 2. S/D contact barrier layers 234A can be configured as diffusion barriers to prevent oxidation of silicide layers 236 and diffusion of other unwanted atoms and/or ions into silicide layers 236 during formation of S/D contact plugs 238A. In some embodiments, S/D contact barrier layers 234A can include a single layer or a stack of conductive materials such as, for example, TiN, Ti, Ni, TiSiN, TaN, Ta, or a combination thereof. In some embodiments, S/D contact barrier layers 234A can act as an adhesion-promoting-layer, a glue-layer, a primer-layer, a protective-layer, and/or a nucleation-layer, for example, S/D contact barrier layers 234A can be TiN to improve Co adhesion. S/D contact barrier layers 234A can have a thickness in a range from about 1 nm to about 3 nm, according to some embodiments.

S/D contact plugs 238A can be disposed within ILD layers 230 and 232 and on silicide layers 236 and can include a conductive material, such as Ru, Ir, Ni, Os, Rh, Al, Mo, W, Co, or Cu. In some embodiments, S/D contact plugs 238A can include a conductive material with low resistivity (e.g., about 50 µΩ-cm, about 30 µΩ-cm, or about 10 µΩ-cm). The portions of S/D contact plugs 238A in ILD layers 230 and 232 can have material composition and/or resistivity similar to or different from each other. In some embodiments, S/D contact plugs 238A can include a stack of three layers, for example, a first layer of Co deposited by PVD, a second layer of Co deposited by CVD, and a third layer of Co deposited by ECP followed by a thermal reflow to form void-free Co-based S/D contact plugs 238A.

In some embodiments, S/D contact plugs 238A can include horizontal dimensions (e.g., width or diameter) along an X-axis in a range from about 10 nm to about 15 nm or less than about 20 nm. S/D contact plugs 238A can have vertical dimensions (e.g., thickness) along a Z-axis ranging from about 50 nm to about 150 nm. S/D contact plugs 238A can have a high aspect ratio ranging from about 5 to about 15, where the aspect ratio can be a ratio of their vertical dimensions (e.g., height) along a Z-axis to their horizontal dimensions (e.g., width or diameter) along an X-axis. In some embodiments, the aspect ratio ranges from about 5 to about 8.

Referring to FIG. 2, gate contact structures 235B can be configured to electrically connect gate structures 108 to other elements of semiconductor device 100 and/or of the integrated circuit. Gate contact structures 235B can be disposed within ILD layer 232 and on gate structures 108. Each of gate contact structures 235B can include (i) a gate contact barrier layer 234B and (ii) a gate contact plug 238B. The above discussion of the material composition of S/D contact barrier layers 234A and S/D contact plugs 238A applies to gate contact barrier layers 234B and gate contact plugs 238B, respectively, unless mentioned otherwise.

High R structure 242 can be a resistor in semiconductor device 100 and/or of the IC. High R structure 242 can be disposed on ESL 240 or within multiple layers of ESL 240. High R structure 242 can include TiN or TaN and can have a vertical dimension along a Z-axis (e.g., thickness) from about 4 nm to about 6 nm.

Via contact structures 247A-247B can be disposed within ESL 240 and ILD layers 232 and 244, and on respective S/D contact plugs 238A and gate contact plugs 238B. Via contact structures 247C can be disposed within ESL 240 and on high R structure 242. In some embodiments, via contact structures 247A-247C include horizontal dimensions (e.g., width or diameter) along an X-axis in a range from about 10 nm to about 15 nm. In some embodiments, via contact structures 247A-247C has an aspect ratio in a range from about 3 to about 15. In some embodiments, via contact structures 247A-247C has an aspect ratio in a range from about 5 to about 8. Via contact structures 247A-247C can include (i) bottom metal capping layer 246A-246C, (ii) via contact plugs 248A-248C disposed on bottom metal capping layer 246A-246C, and (iii) top metal capping layer 250A-250C disposed on via contact plugs 248A-248C.

Bottom metal capping layers 246A-246C can be disposed on S/D contact plugs 238A, gate contact plugs 238B, and high R structure 242, respectively. Bottom metal capping layers 246A-246C can include a conductive material, such as tungsten (W) and can be formed by a selective bottom-up metal deposition process (e.g., bottom-up CVD process), or other suitable processes. In some embodiments, bottom metal capping layers 246A-246C can be deposited at a temperature from about 250° C. to about 300° C. under a pressure from about 5 Torr to about 15 Torr using reaction gases, such as tungsten hexafluoride ($WF_6$) as a W-based precursor and $H_2$. The materials (e.g., W) of bottom metal capping layers 246A-246C can have a higher deposition selectivity for the bottom surfaces of contact openings 962A-962C (not shown in FIG. 2; shown in FIG. 9) of respective via contact structures 247A-247C than the sidewalls of contact openings 962A-962C, thus forming void-free bottom metal capping layers 246A-246C. In some embodiments, bottom metal capping layer 246A-246C can have vertical dimensions 246t (e.g., thickness) along a Z-axis ranging from about 2 nm to about 4 nm. In some embodiments, bottom metal capping layers 246A-246C can prevent corrosions of S/D contact plugs 238A and gate contact plugs 238B during subsequent processes. In some embodiments, the resistance of via contact structures 247A-247C can be large if 246t is larger than 4 nm. In some embodiments, bottom metal capping layer 246A-246C cannot prevent corrosion of S/D contact plugs 238A and gate contact plugs 238B if 246t is smaller than 2 nm.

Via contact plugs 248A-248C can be disposed on respective bottom metal capping layers 246A-246C. Via contact plugs 248A-248C can include Ru, Ir, Ni, Os, Rh, Al, Mo, W, Co, Cu and/or other suitable low-resistivity materials. In some embodiments, via contact plugs 248A-248C can be formed by a selective bottom-up metal deposition process (e.g., bottom-up CVD process) at a temperature ranging from about 150° C. to about 300° C. under a pressure ranging from about 5 Torr to about 15 Torr using reaction gases, such as Ru-based precursor and $H_2$. The materials (e.g., Ru) of via contact plugs 248A-248C can have a higher deposition selectivity for the top surfaces of bottom metal capping layers 246A-246C than the sidewalls of the contact openings 962A-962C, thus forming void-free via contact plugs 248A-248C.

Via contact plugs 248A-248C can have larger horizontal dimensions at the top than at the bottom. In some embodiments, via contact plugs 248A-248C have horizontal dimensions (e.g., width or diameter) 248d1 along an X-axis at the top of via contact plugs 248A-248C ranging from about 10 nm to about 15 nm. In some embodiments, via contact plugs 248A-248C have horizontal dimensions (e.g., width or diameter) 248d2 along an X-axis at the bottom of via contact plugs 248A-248C ranging from about 10 nm to about 12 nm. In some embodiments, via contact plugs 248A-248C have vertical dimensions (e.g., thickness) 248t along a Z-axis ranging from about 30 nm to about 150 nm. In some embodiments, via contact plugs 248A-248C have an aspect ratio ranging from about 5 to about 8, where the aspect ratio can be a ratio of their vertical dimensions (e.g., height) along a Z-axis to their top horizontal dimensions (e.g., width or diameter 248d1) along an X-axis. In some embodiments, a thickness ratio of 248t to 246t ranges from about 7 to about 80. In some embodiments, Ru-based via contact plugs 248A-248C with dimensions from about 10 nm to about 15 nm and with aspect ratio from about 5 to about 8 have lower resistivity compared to W- or Co-based via contact plugs 248A-248C with similar dimensions. In some embodiments, a critical dimension 248w between the top of via contact plugs 248A-248B ranges from about 5 nm to about 8 nm to prevent electrical short between S/D contact structures 235A and gate contact structures 235B.

Top metal capping layers 250A-250C can be disposed on via contact plugs 248A-248C. The above discussion of bottom metal capping layers 246A-246C applies to top metal capping layer 250A-250C, unless mentioned otherwise. Top metal capping layers 250A-250C can have vertical dimensions 250t (e.g., thickness) along a Z-axis ranging from about 2 nm to about 4 nm. In some embodiments, a thickness ratio of 248t to 250t ranges from about 7 to about 80. In some embodiments, top metal capping layers 250A-250C can prevent electromigration of metals (e.g., Cu) from overlying respective interconnect structures 257A-257C. In some embodiments, the resistance of via contact structures 247A-247C can be large if 250t is larger than 4 nm. In some embodiments, top metal capping layer 250A-250C cannot prevent electromigration of metals (e.g., Cu) from overlying respective interconnect structures 257A-257C if 250t is smaller than 2 nm.

According to some embodiments, via contact structures 247A-247C with W-based bottom metal capping layers 246A-246C, Ru-based via contact plugs 248A-248C, and W-based top metal capping layers 250A-250C having dimensions from about 10 nm to about 15 nm and aspect ratio from about 5 to about 8 can have lower resistivity compared to W- or Co-based via contact structures 247A-247C with similar dimensions. In some embodiments, dual metal capped via contact structures 247A-247C can reduce contact resistivity by about 10% to about 30% compared to via contact structures without dual metal capping layers. Dual metal capped via contact structures 247A-247C can also prevent corrosions of S/D contact plugs 238A and gate contact plugs 238B and prevent electromigration of metals from overlying interconnect structures 257A-257C.

Interconnect structures 257A-257C can be disposed on respective via contact structures 247A-247C. In some embodiments, interconnect structures 257A-257C can include barrier layers 256 and conductive lines 258. In some embodiments, barrier layers 256 can include a single layer or a stack of conductive materials including such as, TiN, Ti, Ni, TaN, Ta, Co, or a combination thereof. In some embodiments, barrier layers 256 can act as an adhesion-promoting-layer, a glue-layer, a primer-layer, a protective-layer, and/or a nucleation-layer. Barrier layers 256 can have a thickness in a range from about 1 nm to about 5 nm. In some embodiments, barrier layers 256 can include a first TaN layer deposited by ALD with a thickness ranging from about 0.5 nm to about 1.5 nm, a second TaN layer, on the first TaN layer, deposited by PVD with a thickness ranging from about 0.5 nm to about 1.5 nm, a Co liner, on the second TaN layer, deposited by CVD with a thickness ranging from about 1 nm to about 3 nm, and a Cu seed layer, on the Co liner, deposited by PVD with a thickness ranging from about 1 nm to about 2 nm.

Conductive lines 258 can include conductive material such as, W, Al, Co, or Cu and can be deposited using CVD or other suitable metal deposition process. In some embodiments, conductive lines 258 can include a single layer or a stack of conductive materials. In some embodiments, conductive lines 258 can have horizontal dimension (e.g., width) along an X-axis ranging from about 20 nm to about 25 nm. In some embodiment, conductive lines 258 can have an aspect ratio ranging from about 2 to about 3, where the aspect ratio can be a ratio of their vertical dimensions (e.g., height) along a Z-axis to their horizontal dimensions (e.g., width) along an X-axis.

Semiconductor device 100 can further include an ESL 252 disposed on ILD layer 244 and a low-k layer 254 disposed on ESL 252. Interconnect structures 257A-257C can be formed within ESL 252 and low-k layer 254 as shown in FIG. 2. In some embodiments, ESL 252 can include aluminum oxide ($AlO_x$) deposited by ALD. In some embodiments, ESL 252 can be deposited using trimethylaluminum (TMA) and $H_2O$ as precursors at a temperature ranging from about 200° C. to about 350° C. In some embodiments, ESL 252 can have a vertical dimension (e.g., thickness) along a Z-axis ranging from about 3 nm to about 5 nm. In some embodiments, low-k layer 254 can include low-k materials having a dielectric constant less than about 3.9. In some embodiments, low-k material can include SiOC, SiCN, SiOCN, SiOCH, porous $SiO_2$, and/or a combination thereof. In some embodiments, low-k layer 254 can have a vertical dimension (e.g., thickness) along a Z-axis ranging from about 50 nm to about 60 nm. In some embodiments, low-k layer 254 can reduce time delay of semiconductor device 100.

Figure 3:
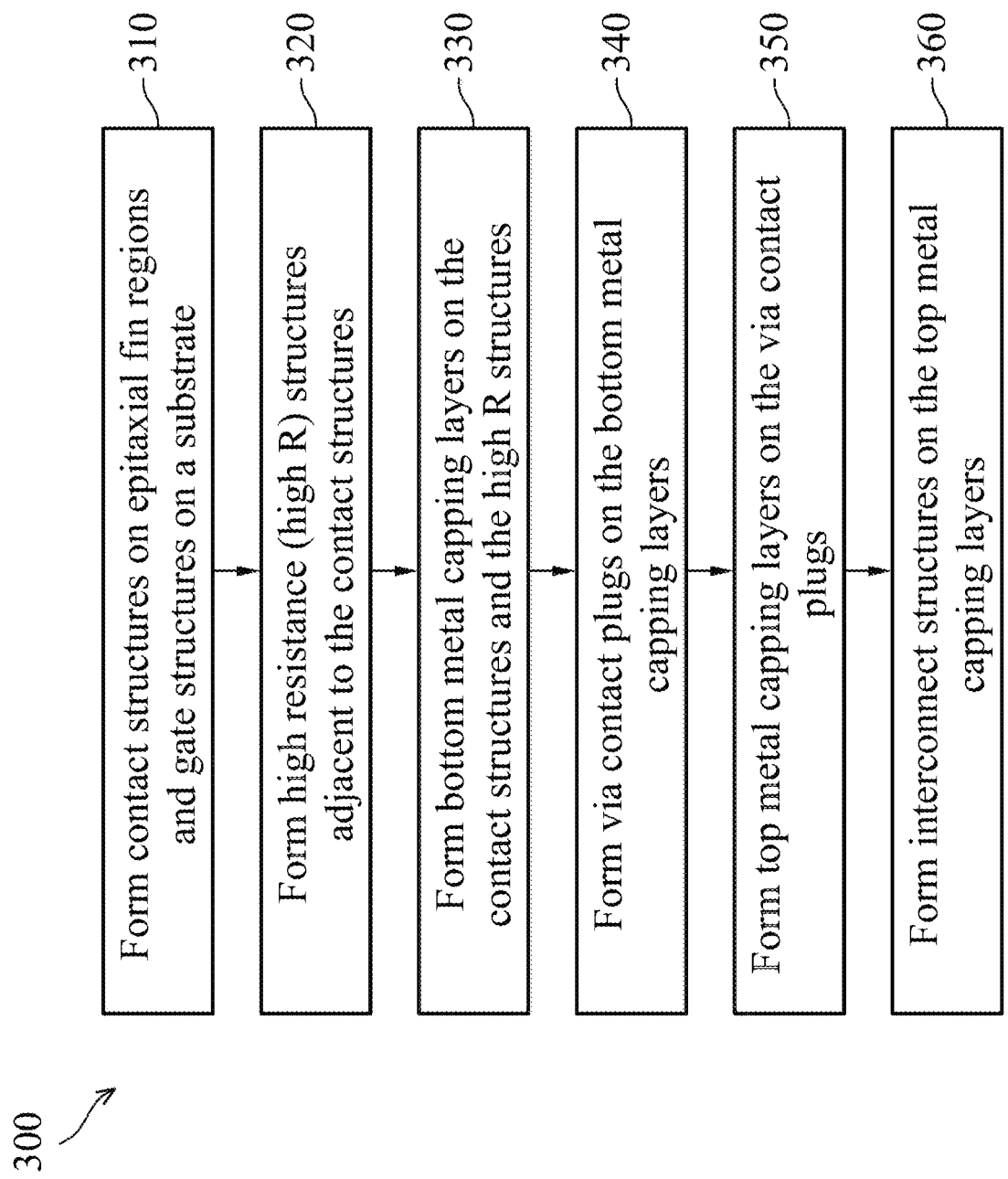
FIG. 3 is a flow diagram of a method for fabricating a semiconductor device with via contact structures, in accordance with some embodiments.

FIG. 3 is a flow diagram of an example method 300 for fabricating semiconductor device 100, according to some embodiments. For illustrative purposes, the operations illustrated in FIG. 3 will be described with reference to the example fabrication process for fabricating semiconductor device 100 as illustrated in FIGS. 4-13. FIGS. 4-13 are cross-sectional views of area 114 of semiconductor device 100 in FIG. 1 at various stages of its fabrication process, according to some embodiments. Operations can be performed in a different order or not performed depending on specific applications. It should be noted that method 300 may not produce a complete semiconductor device 100. Accordingly, it is understood that additional processes can be provided before, during, and after method 300, and that some other processes may only be briefly described herein. Elements in FIGS. 4-13 with the same annotations as elements in FIGS. 1-2 are described above.

In operation 310, contact structures are formed on epitaxial fin regions and gate structures. For example, as described with reference to FIGS. 4-6, S/D contact structures 235A (shown in FIG. 6) can be formed on epitaxial fin regions 105 and gate contact structures 235B (shown in FIG. 6) can be formed on gate structures 108. The formation of S/D contact structures 235A and gate contact structures 235B can include sequential steps of: (i) forming S/D contact openings 460A and gate contact openings 460B (shown in FIG. 4); (ii) selectively forming silicide layers 236 within S/D contact openings 460A and on epitaxial fin regions 105 (shown in FIG. 5); and (iii) forming contact barrier layers 234A-234B and contact plugs 238A-238B (shown in FIG. 6).

Figure 4:
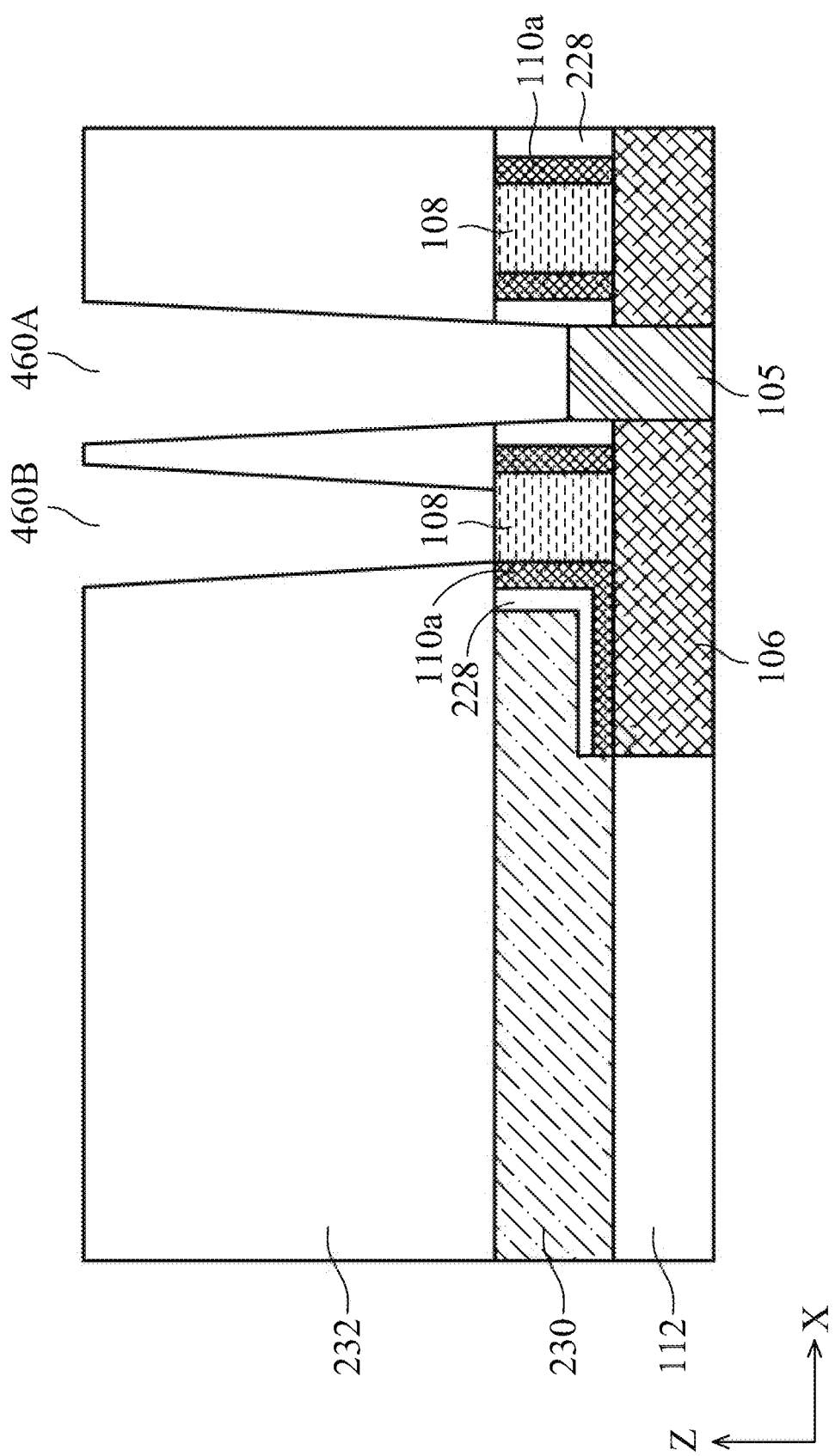
FIGS. 4-13 illustrate cross-sectional views of a semiconductor device at various stages of its fabrication process, in accordance with some embodiments.

Referring to FIG. 4, the formation of contact openings 460A-460B can include blanket depositing ILD layer 232 on ILD layer 230, epitaxial fin regions 105, and gate structures 108. ILD layer 232 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide, silicon oxycarbide, TEOS oxide, or a combination thereof. In some embodiments, ILD layer 232 can include silicon oxide ($SiO_2$), SiOC, zirconium oxide ($ZrO_2$), hafnium oxide ($HfO_2$), or dielectric materials with high-k, low-k (e.g., k-value in a range from about 3.9 to about 3.0), or extreme low-k (e.g., k-value in a range from about 2.9 to about 2.0). In some embodiments, ILD layer 232 can have a thickness along a Z-axis in a range from about 100 nm to about 600 nm.

The formation of ILD layer 232 can be followed by an etching of ILD layer 232 to form contact openings 460A-460B on epitaxial fin regions 105 and gate structures 108, respectively. Prior to the etching of ILD layer 232, a patterned photoresist layer and a hard mask layer can be formed on ILD layer 232. Portions of the hard mask layer not covered by the patterned photoresist layer can be etched to expose underlying ILD layer 232. The exposed ILD layer 232 can be etched to form contact openings 460A-460B followed by the removal of the patterned photoresist layer and the hard mask layer. Contact openings 460A-460B can be formed by a dry etching process. In some embodiments, the dry etching process can include fluorine or chlorine based etchants followed by a wet clean process. In some embodiments, the wet clean process can include using a solution of de-ionized water (DI), $NH_4OH$, and $H_2O_2$.

Figure 5:
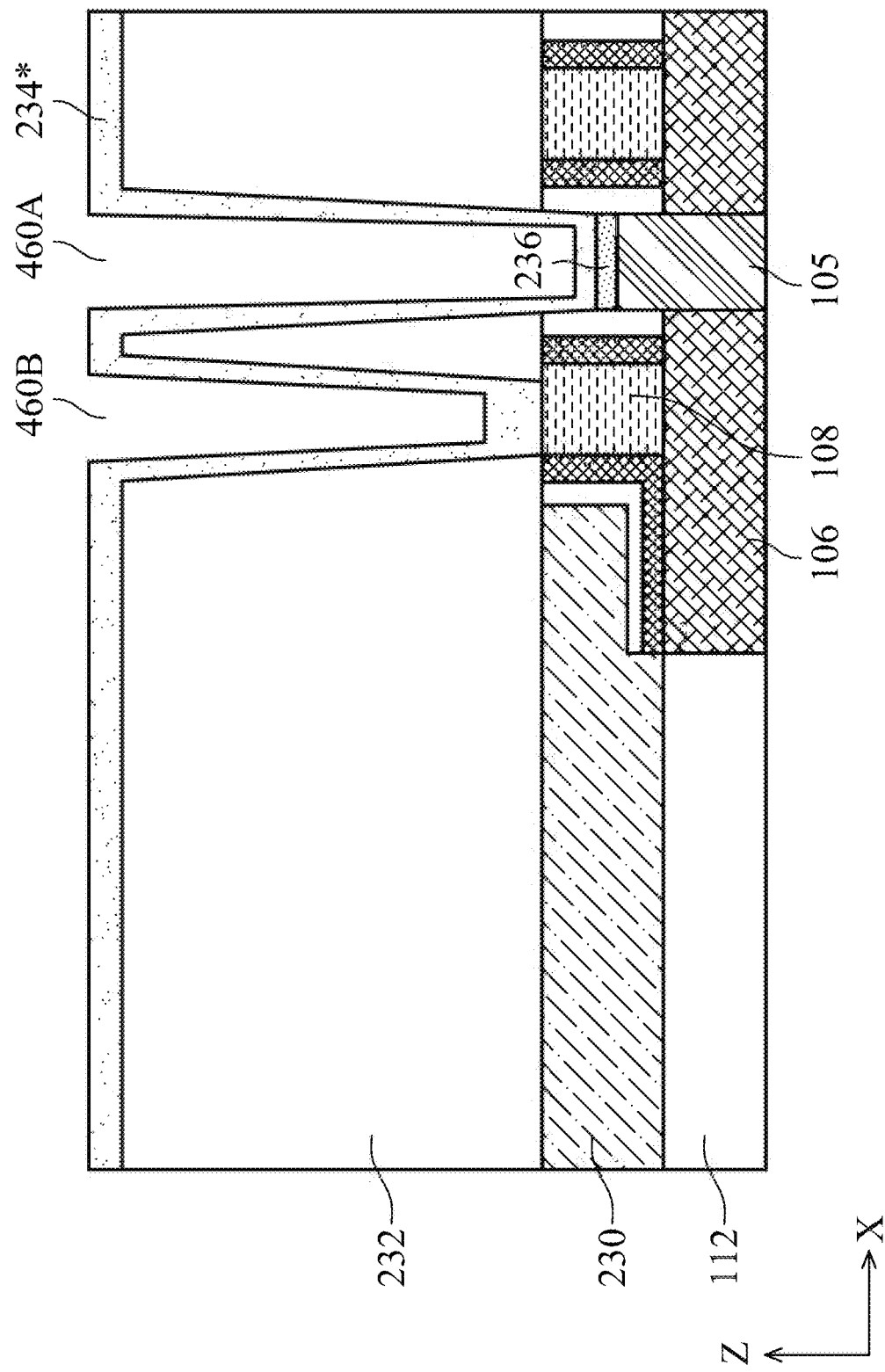

Referring to FIG. 5, the selective formation of silicide layers 236 can include sequential steps of: (i) a pre-deposition cleaning, (ii) blanket depositing a contact barrier layer 234*, (iii) thermal annealing the blanket deposited contact barrier layer 234*, and (iv) removing thermally annealed contact barrier layer 234*. The pre-deposition cleaning can be performed on the structure of FIG. 4 and can include a directional dry etch process to clean the bottom surfaces of contact openings 460A-460B and an isotropic dry etch process (e.g., SiCoNi etch process), which includes using a remote plasma assisted dry etch process that involves the simultaneous exposure of contact openings 460A-460B to $H_2$, $NF_3$, and $NH_3$ plasma by-products to clean the bottom surfaces and sidewalls of contact openings 460A-460B. The directional dry etch process can include using fluorine based etchants, such as nitrogen trifluoride ($NF_3$) and ammonia ($NH_3$). The directional dry etch process can be performed at a temperature ranging from about 50° C. to about 120° C. The isotropic dry etch process can also include using fluorine based etchants (e.g., $NF_3$ and $NH_3$), but without any bias. The isotropic dry etch process can be performed at a temperature ranging from about 150° C. to about 210° C.

Contact barrier layer 234* can be blanket deposited on the structure of FIG. 4 after the pre-deposition cleaning process. Contact barrier layer 234* can be substantially conformally deposited within contact openings 460A-460B and on the top surface of ILD layer 232 by PVD, ALD, and/or other suitable deposition methods. In some embodiments, contact barrier layer 234* can include a single layer or a stack of conductive materials such as, TiN, Ti, Ni, TiSiN, TaN, Ta, or a combination thereof. Contact barrier layer 234* can have a thickness in a range from about 1 nm to about 3 nm, according to some embodiments. In some embodiments, contact barrier layers 234* can include a stack of two layers, for example, a layer of Ti deposited by PVD with a thickness ranging from about 5 nm to about 15 nm and a layer of TiN deposited by ALD with a thickness ranging from about 1 nm to about 5 nm.

The thermal annealing process can be performed on the structure of FIG. 4 after the blanket deposition of contact barrier layer 234* at a temperature ranging from about 450° C. to about 700° C. In some embodiments, the thermal annealing process can be performed in nitrogen at an atmospheric pressure for a period ranging from about 10 seconds to about 20 seconds. After the thermal annealing process, silicide layers 236 can be selectively formed between epitaxial fin regions 105 and contact barrier layers 234* due to a silicidation reaction between the Si-based material of epitaxial fin regions 105 and contact barrier layer 234*. There is no silicide layers formed between gate structures 108 and contact barrier layer 234* because of the absence of silicon-based material in metal gate structures 108, unlike epitaxial fin regions 105. Silicide layers 236 can have vertical dimensions (e.g., thickness) along a Z-axis in a range from about 4 nm to about 6 nm. Silicide layers 236 can provide a low resistance interface between epitaxial fin regions 105 and subsequently formed S/D contact plugs 238A.

The removal of contact barrier layer 234* from the structure of FIG. 5 can include a wet etch process. The wet etch process can include using a solution of de-ionized water (DI), NH$_4$OH, and H$_2$O$_2$ or other suitable etchants. In some embodiments, contact barrier layer 234* can be oxidized and removed while silicide layers 236 can remain on epitaxial fin regions 105.

The removal of contact barrier layers 234* can be followed by the formation of contact barrier layers 234A-234B and contact plugs 238A-238B, which can include sequential steps of: (i) Ar-based cleaning, (ii) blanket depositing the material(s) for contact barrier layers 234A-234B, (iii) blanket depositing the material(s) for contact plugs 238A-238B, and (iv) chemical mechanical polishing (CMP) the blanket deposited material(s) for contact barrier layers 234A-234B and contact plugs 238A-238B.

The Ar-based cleaning can be performed to remove surface oxides from the top surfaces of gate structures 108 and silicide layers 236. In some embodiments, the Ar-based cleaning can be performed using Ar gas at a flow rate ranging from about 5 sccm to about 20 sccm with a source RF power ranging from about 250 W to about 350 W and a bias RF power ranging from about 400 W to about 500 W for a period ranging from about 2 seconds to about 8 seconds. The material(s) for contact barrier layers 234A-234B can be blanket deposited on the structure of FIG. 5 after the removal of contact barrier layer 234* and the Ar-based cleaning. The above discussion of the deposition process and materials of contact barrier layers 234* applies to the deposition process and materials of contact barrier layers 234A-234B, unless mentioned otherwise. In some embodiments, contact barrier layers 234A-234B can include TiN deposited by ALD with a thickness ranging from about 1 nm to about 2 nm.

The material(s) for contact plugs 238A-238B can be blanket deposited on the blanket deposited material(s) for contact barrier layers 234A-234B. In some embodiments, contact plugs 238A-238B can include a stack of three metal layers, for example, a layer of first metal (e.g., Ru, Ir, Ni, Os, Rh, Al, Mo, W, or Co) deposited by PVD, a layer of second metal (e.g., Ru, Ir, Ni, Os, Rh, Al, Mo, W, or Co) deposited by CVD on the first metal, and a layer of third metal (e.g., Ru, Ir, Ni, Os, Rh, Al, Mo, W, or Co) deposited by electrochemical plating (ECP) on the second metal, where the first, second, and third metal can be similar to or different from each other. The layer of first metal can be deposited directionally and selectively on the bottom surfaces of contact openings 460A-460B and on the top surface of ILD layer 232 with a thickness ranging from about 5 nm to about 10 nm and not along the sidewalls of contact openings 460A-460B. The layer of second metal can be deposited conformally on the layer of first metal and along the sidewalls of contact openings 460A-460B with a thickness ranging from about 1 nm to about 3 nm. The layer of third metal can fill the remaining portions of contact openings 460A-460B that are not filled by the layers of first and second metal.

A thermal reflow process can follow the deposition of the material(s) for S/D contact plugs 238A and gate contact plugs 238B to form void-free contact structures 235A-235B. For example, a thermal reflow process can reflow the first, second, third metals and form void-free contact structures 235A-235B for three layers of metal (e.g., Ru, Ir, Ni, Os, Rh, Al, Mo, W, or Co) deposited by PVD, CVD, and ECP. The thermal reflow process can be performed in a gas mixture of hydrogen and nitrogen or inert gases (e.g., Ar). In some embodiments, the gas mixture can include hydrogen at a concentration higher than 30%. The thermal reflow process can be performed at a temperature ranging from about 300° C. to about 400° C. for a period ranging from about 1 min to about 10 min. The thermal reflow can be followed by the CMP process to substantially coplanarize the top surfaces of S/D contact structures 235A, gate contact structures 235B, and ILD layer 232, as shown in FIG. 6.

Referring back to FIG. 3, in operation 320, high resistance structures are formed adjacent to the gate contact structures and the S/D contact structures. For example, as described with reference to FIGS. 7-8, high resistance structure 242 can be formed adjacent to S/D contact structures 235A and gate contact structures 235B. The process for forming high resistance structure 242 can include sequential steps of: (i) blanket depositing a first ESL 740A (shown in FIG. 7); (ii) blanket depositing a layer of high resistive material on first ESL 740A; (iii) blanket depositing a second ESL 740B on the layer of high resistive material; (iv) etching a portion of second ESL 740B and the layer of high resistive material (shown in FIG. 7); (v) blanket depositing a third ESL on the etched second ESL 740B and the layer of high resistive material; (vi) blanket depositing the material(s) for ILD layer 244 on the third ESL; and (vii) chemical mechanical polishing (CMP) the blanket deposited third ESL and the material(s) for ILD 244.

Figure 6:
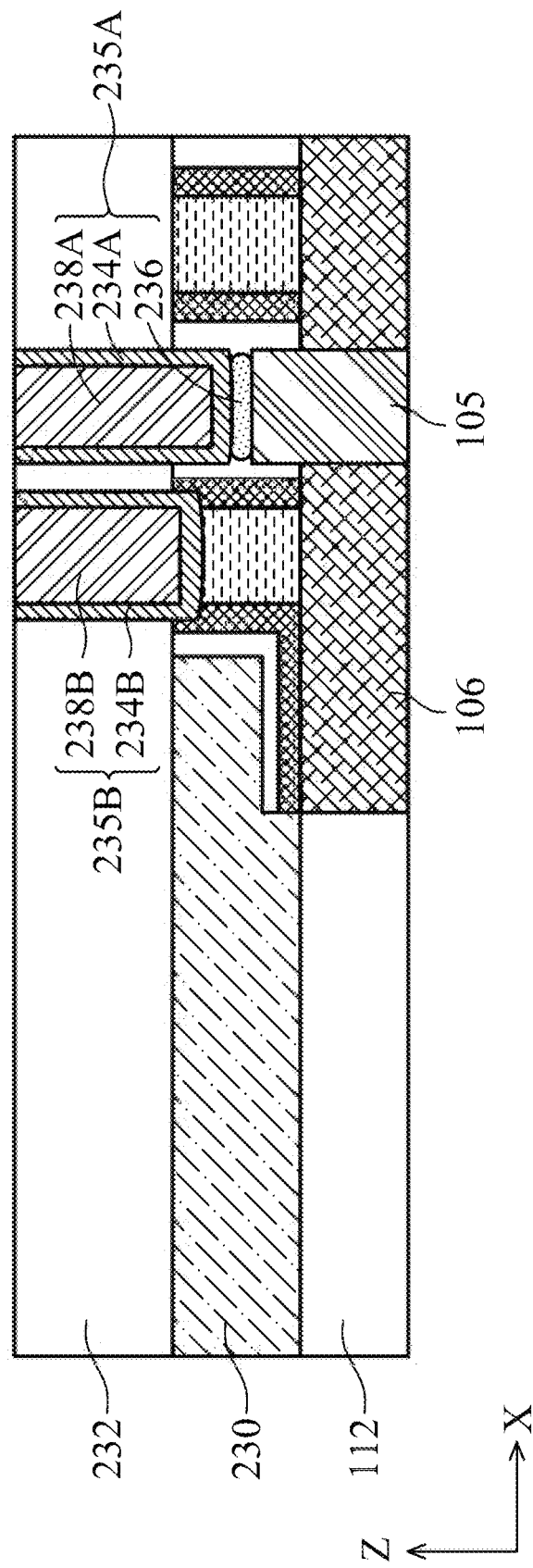
Figure 7:
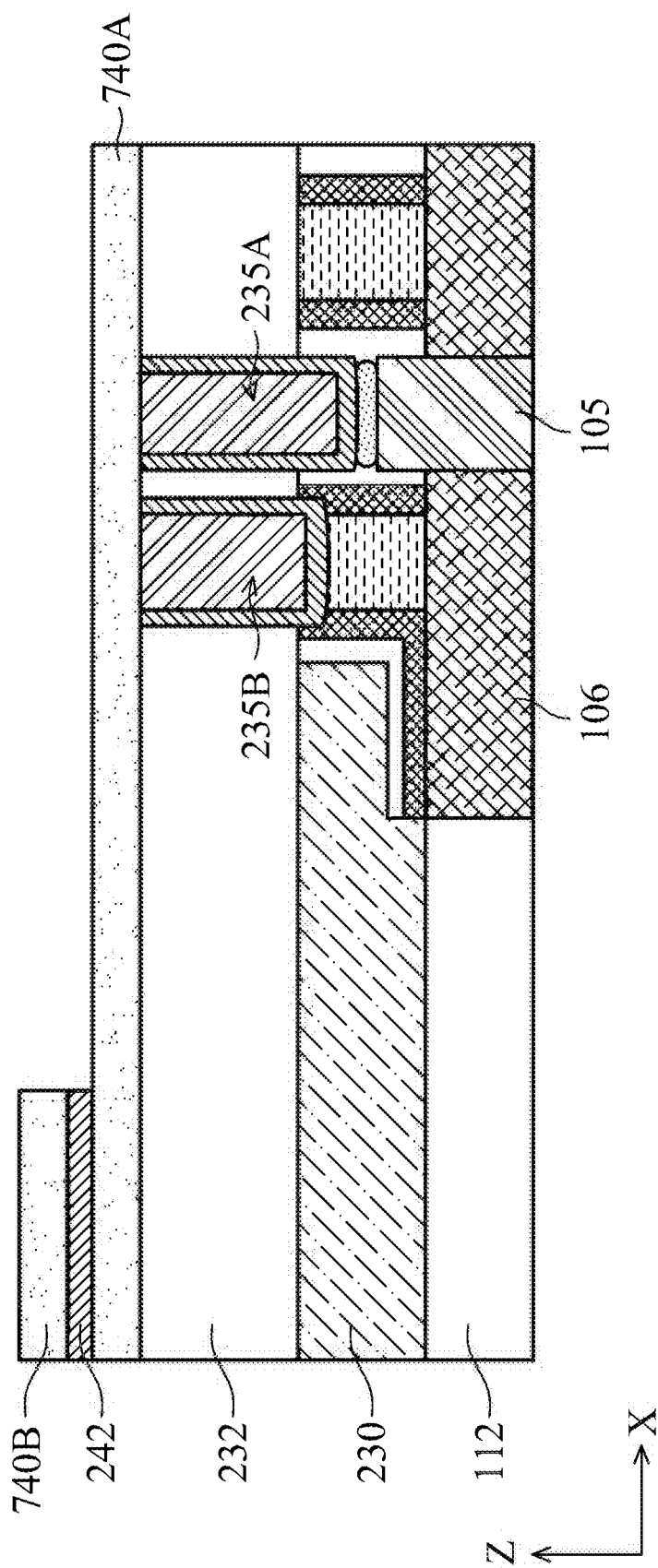

Referring to FIG. 7, first ESL 740A can be blanket deposited on the structure of FIG. 6. The above discussion of ESL 240 applies to first ESL 740A, unless mentioned otherwise. In some embodiments, first ESL 740A can be blanket deposited by ALD or CVD with a thickness along a Z-axis ranging from about 0.5 nm to about 2 nm. In some embodiments, first ESL 740A can include silicon nitride (SiN$_x$). In some embodiment, the blanket deposition of first ESL 740A can be performed at a temperature ranging from about 300° C. to about 500° C.

The layer of high resistive material can be blanket deposited on first ESL 740A. In some embodiments, the layer of high resistive material can be blanket deposited by PVD with a thickness along a Z-axis ranging from about 1 nm to 7 nm. The above discussion of first ESL 740A applies to second ESL 740B, unless mentioned otherwise. Second ESL 740B can have a thickness along a Z-axis ranging from about 0.5 nm to about 1.5 nm. Second ESL 740B and the layer of high resistive material can be patterned and etched by a dry etch process. In some embodiments, the dry etch process can include chlorine-based etchants and followed by a diluted (e.g., 500:1) HF clean. A portion of second ESL 740B and the layer of high resistive material can be removed after the etching process, and high R structure 242 can be formed as shown in FIG. 7.

Figure 8:
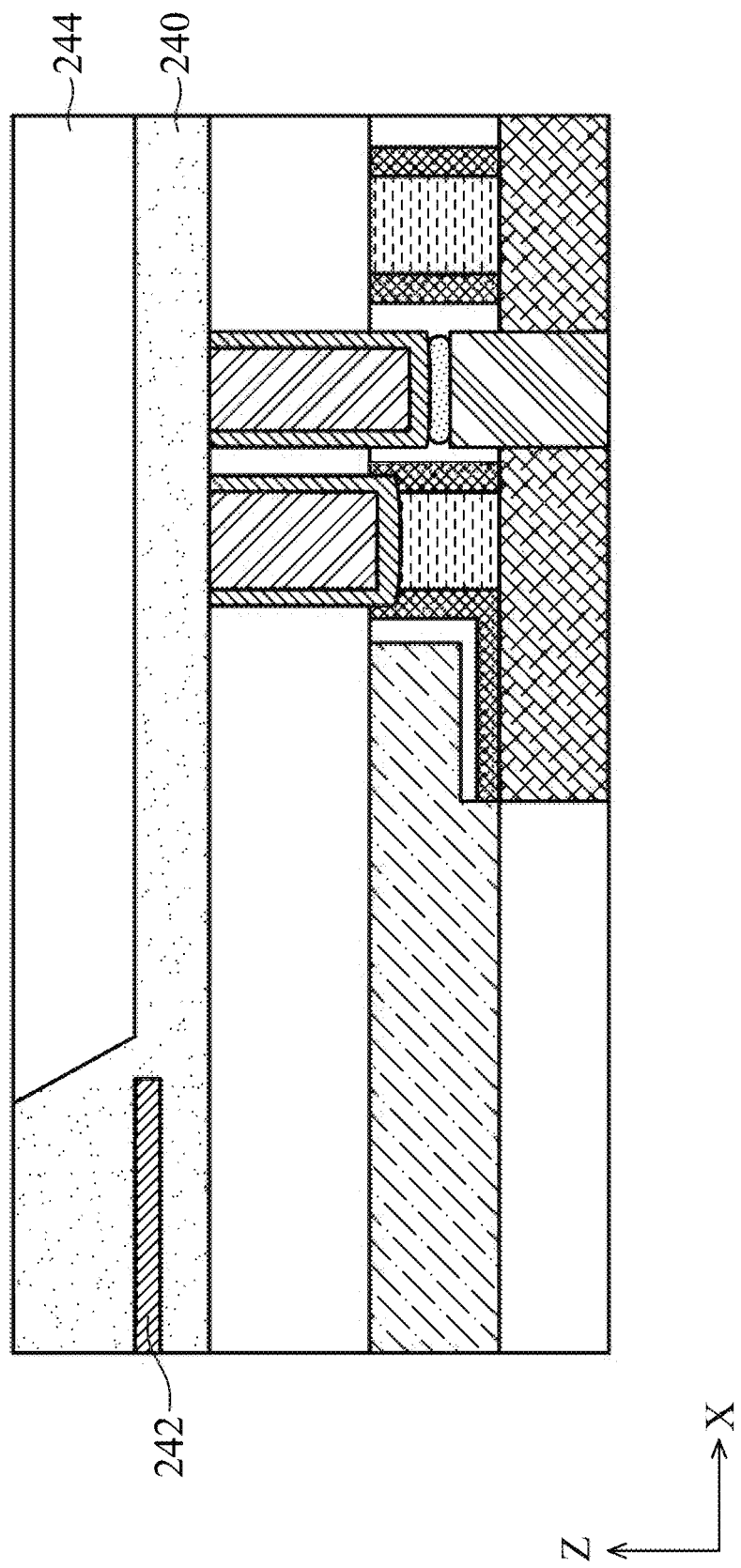

Referring to FIG. 8, the third ESL and the material (s) for ILD layer 244 can be blanket deposited on the structure of FIG. 7. The above discussion of first ESL 740A applies to the third ESL, unless mentioned otherwise. In some embodiments, the third ESL can have a thickness along a Z-axis ranging from about 0.5 nm to about 1.5 nm. In some embodiments, the material (s) for ILD layer 244 can be blanket deposited on the third ESL by CVD with a thickness along a Z-axis ranging from about 10 nm to about 30 nm. The blanket deposition of the third ESL and the material(s) for ILD layer 244 can be followed by a CMP process to form ESL 240 and ILD layer 244 as shown in FIG. 8, and substantially coplanarize the top surfaces of ESL 240 and ILD layer 244.

Referring back to FIG. 3, in operation 330, bottom metal capping layers are formed on the S/D contact structures, gate contact structures, and high R structures. For example, as described with reference to FIGS. 9-11, bottom metal capping layers 246A-246C can be formed on S/D contact structures 235A, gate contact structures 235B, and high R structure 242, respectively, (shown in FIG. 11). The process for forming bottom metal capping layers 246A-246C can include sequential steps of: (i) forming via contact openings 962A-962C (shown in FIG. 9); (ii) forming contact plug recesses 1062A-1062B in S/D contact plugs 238A and gate contact plugs 238B (shown in FIG. 10); and (iii) in-situ selectively bottom-up depositing the material(s) for bottom metal capping layers 246A-246C within contact plug recesses 1062A-1062B and via contact opening 962C (shown in FIG. 11).

Figure 9:
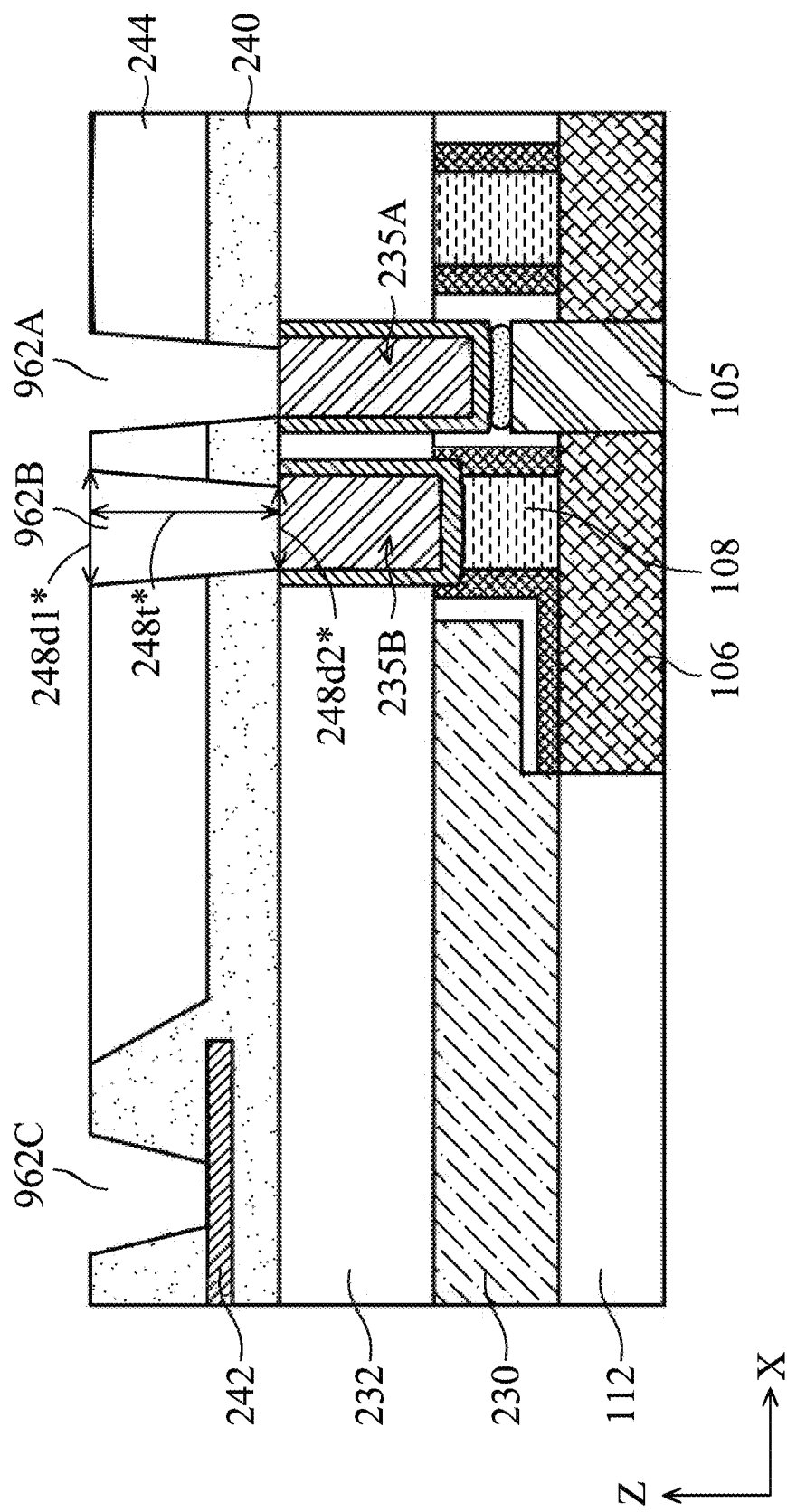

Referring to FIG. 9, via contact openings 962A-962C can be formed on S/D contact structures 235A, gate contact structures 235B, and high R structure 242, respectively. A patterned photoresist layer can be formed on the structure of FIG. 8. Portions of ILD layer 244 and ESL 240 not covered by the patterned photoresist layer can be etched to form via contact openings 962A-962C. Etching of ILD layer 244 and ESL 240 can include a dry etch process. In some embodiments, the dry etching process can include fluorine or chlorine based etchants followed by a wet clean process. Other etching methods and processes for via contact opening are within the scope and spirit of this disclosure.

In some embodiments, via contact openings 962A-962C can have horizontal dimensions (e.g., width or diameter) 248$d1$* along an X-axis at the top of via contact openings 962 ranging from about 10 nm to about 15 nm. In some embodiments, via contact openings 962A-962C can have horizontal dimensions (e.g., width or diameter) 248$d2$* along an X-axis at the bottom of via contact openings 962A-962C ranging from about 10 nm to about 12 nm. In some embodiments, via contact openings 962A-962C can have vertical dimensions (e.g., thickness) 248$t$* along a Z-axis ranging from about 30 nm to about 150 nm. In some embodiments, via contact openings 962A-962C can have an aspect ratio ranging from about 5 to about 8, where the aspect ratio can be a ratio of their vertical dimensions (e.g., height) along a Z-axis to their top horizontal dimensions (e.g., width or diameter 248$d1$*) along an X-axis.

Figure 10:
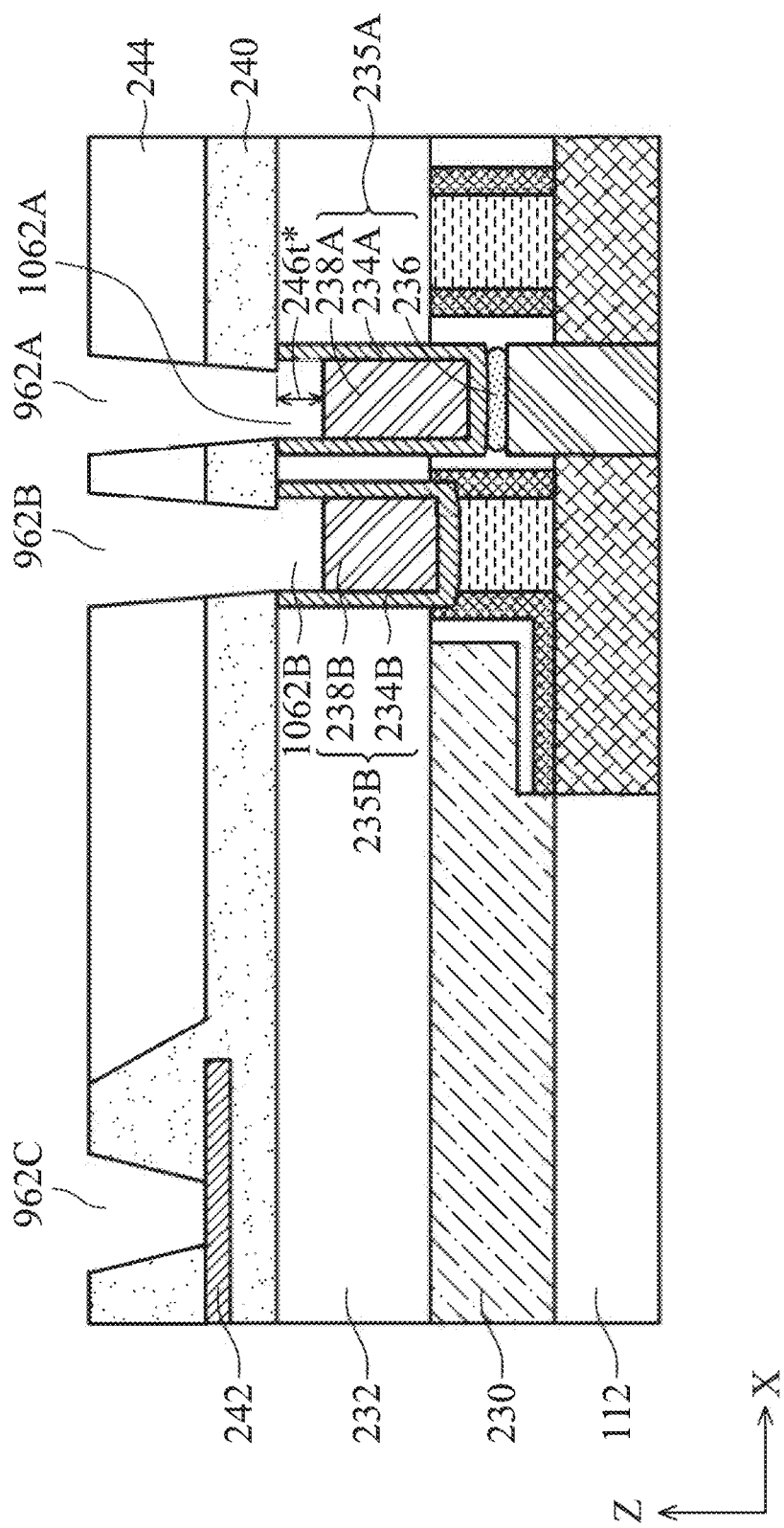

Referring to FIG. 10, contact plug recesses 1062A-1062B in S/D contact plugs 238A and gate contact plugs 238B can be formed by etching back contact plugs 238A-238B, respectively. The etch back process can include a wet etch process performed on the structure of FIG. 9. In some embodiment, the wet etch process can selectively etch S/D contact plugs 238A and gate contact plugs 238B without etching high R structure 242. In some embodiments, the wet etch process can include using a solution of de-ionized water (DI), $NH_4OH$, and $H_2O_2$ at a temperature ranging from about 20° C. to about 50° C. for a period ranging from about 3 seconds to about 120 seconds. After the etch back process, S/D contact plugs 238A and gate contact plugs 238B can be recessed by a vertical dimension 246$t$* (e.g., thickness) along a Z-axis ranging from about 2 nm to about 4 nm to form contact plug recesses 1062A-1062B. Other etching methods, etchants, etching temperatures, times, and recess dimensions for contact plug recesses 1062A-1062B are within the scope and spirit of this disclosure.

Figure 11:
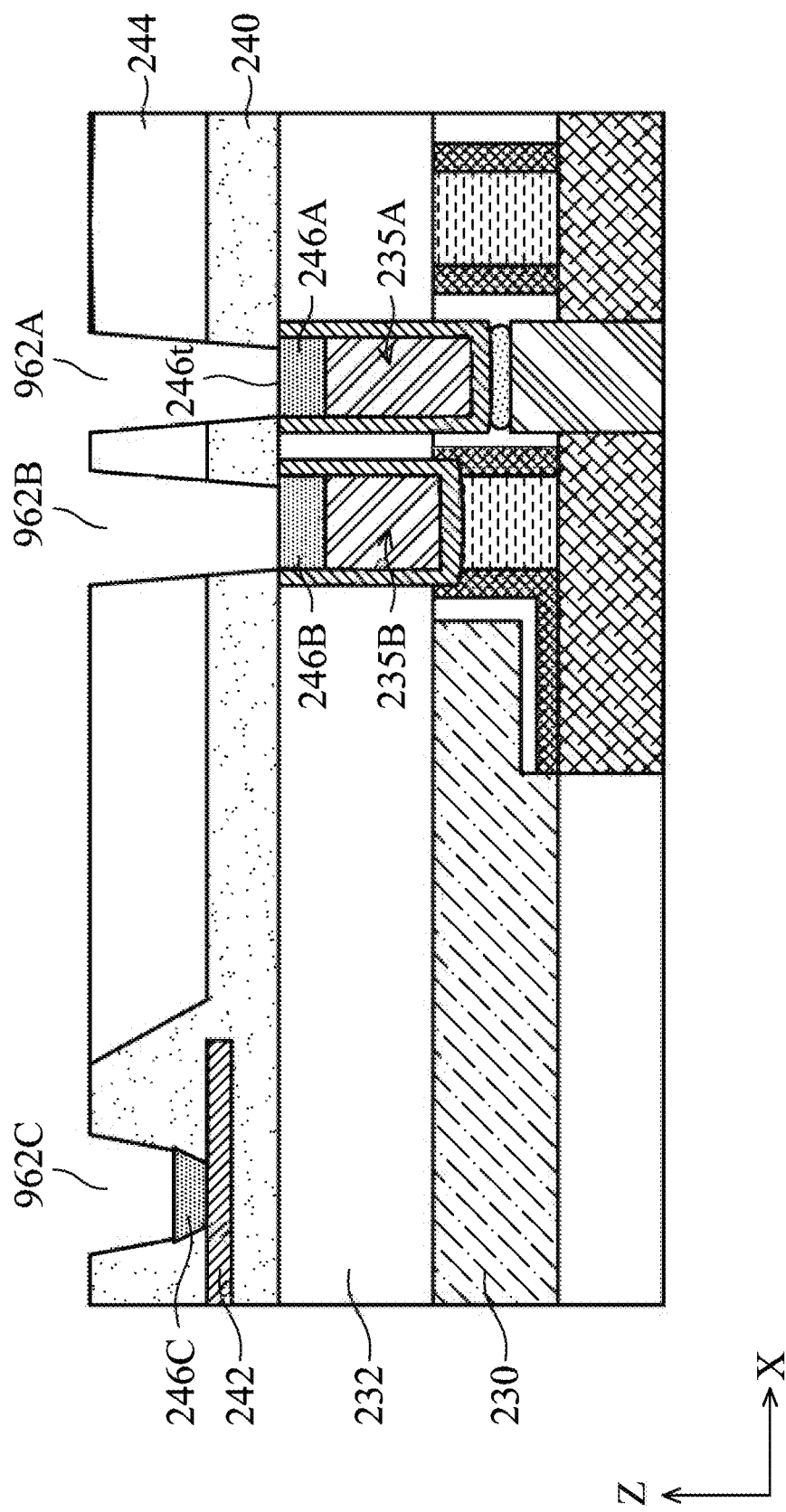

Referring to FIG. 11, bottom metal capping layers 246A-246C can be formed on recessed S/D contact plugs 238A, recessed gate contact plugs 238B, and high R structure 242, respectively. Prior to the formation of bottom metal capping layers 246A-246C, a thermal annealing in $H_2$ can be performed to remove surface oxides from top surfaces of recessed S/D contact plugs 238A, gate contact plugs 238B, and high R structure 242 to form substantially oxide-free (e.g., no oxide) top surfaces of recessed S/D contact plugs 238A, gate contact plugs 238B, and high R structure 242. The removal of these surface oxides can increase the deposition selectivity of the metal(s) of bottom metal capping layers 246A-246C to S/D contact plugs 238A, gate contact plugs 238B, and high R structure 242 than to the sidewalls of via contact openings 962A-962C, thus allowing selective bottom-up deposition of the metal(s) of bottom metal capping layers 246A-246C in subsequent formation of substantially void-free (e.g., no voids) bottom metal capping layers 246A-246C. In some embodiments, the $H_2$ thermal annealing can be performed using a $H_2$ gas mixture at a flow rate ranging from about 3000 sccm to about 6000 sccm under a pressure ranging from about 5 Torr to about 30 Torr. The concentration of $H_2$ gas in the $H_2$ gas mixture can range from about 10% to about 50% and the $H_2$ thermal annealing can be performed at a temperature ranging from about 350° C. to about 450° C. such that the surface oxides can be removed after the $H_2$ thermal annealing. Other methods to remove surface oxides are within the scope and spirit of this disclosure.

The $H_2$ thermal annealing can be followed by the in-situ selective bottom-up deposition of the metal(s) of bottom metal capping layers 246A-246C. In some embodiments, the in-situ selective bottom-up deposition can include a CVD process and can be performed at a temperature ranging from about 250° C. to about 300° C. under a pressure from about 5 Torr to about 15 Torr using reaction gases, such as $WF_6$ and $H_2$. In some embodiments, bottom metal capping layers 246A-246C can have vertical dimensions 246$t$ (e.g., thickness) along a Z-axis ranging from about 2 nm to about 4 nm based on the process time. In some embodiments, bottom metal capping layers 246A-246C can prevent corrosions of S/D contact plugs 238A and gate contact plugs 238B during subsequent processes. Other deposition methods, processes, and dimension of bottom metal capping layers 246A-246C are within the scope and spirit of this disclosure.

Referring back to FIG. 3, in operation 340, via contact plugs are formed on the bottom metal capping layers. For example, as described with reference to FIGS. 12-13, via contact plugs 248A-248C can be formed on respective bottom metal capping layers 246A-246C. The process for forming via contact plugs 248A-248C can include sequential steps of: (i) Ar cleaning top surfaces of bottom metal capping layers 246A-246C; (ii) in-situ selectively bottom-up depositing the metal(s) for via contact plugs 248A-248C; (iii) chemical mechanical polishing (CMP) the deposited metal(s) (shown in FIG. 12); and (iv) etching back the chemical mechanical polished metal(s) (shown in FIG. 13).

The Ar cleaning process can include an Ar plasma etch and can be performed on the structure of FIG. 11 to remove surface oxides from top surfaces of bottom metal capping layers 246A-246C to form substantially oxide-free (e.g., no oxide) top surfaces of bottom metal capping layers 246A-246C. The removal of these surface oxides can increase the deposition selectivity of the metal(s) of via contact plugs 248A-248C to bottom metal capping layers 246A-246C than to the sidewalls of via contact openings 962A-962C, thus allowing selective bottom-up deposition of the metal(s) of via contact plugs 248A-248C in subsequent formation of substantially void-free (e.g., no voids) via contact plugs 248A-248C. In some embodiments, the Ar cleaning process can be performed using Ar gas at a flow rate ranging from about 5 sccm to about 20 sccm for a period ranging from about 2 seconds to about 8 seconds. In some embodiments, the Ar cleaning process can be performed with source RF power ranging from about 250 W to about 350 W and bias RF power ranging from about 400 W to about 500 W. Other cleaning process methods and processes are within the scope and spirit of this disclosure.

The Ar cleaning process can be followed by in-situ selective bottom-up deposition of the metal(s) for via contact plugs 248A-248C within via contact openings 962A-962C. In some embodiments, the in-situ selective bottom-up deposition process can include a CVD process and can be performed at a temperature ranging from about 150° C. to about 300° C. under a pressure from about 5 Torr to about 15 Torr using reaction gases, such as Ru-based precursor and $H_2$. In some embodiments, the Ru-based precursors can include Ruthenium, tricarbonyl[(1,2,4,5-.eta.)-1-methyl-1,4-cyclohexadiene] ($C_{10}H_{10}O_3Ru$), (η6-benzene)((η6-benzene)(η4-1,3-cyclohexadiene) ruthenium (Ru(C6H6)(C6H8)), Ruthenium(III) acetylacetonate 1,3-cyclohexadiene ($Ru(C_5H_7O_2)_3$), (tricarbonyl) ruthenium(0) ($Ru(CO)_3(C_6H_8)$), Bis(ethylcyclopentadienyl) Ruthenium (II) ($Ru(C_5H_4C_2H_5)_2$); Ruthenium pentacarbonyl ($Ru(CO)_5$), or Triruthenium dodecacarbonyl ($Ru_3(CO)_{12}$).

Figure 12:
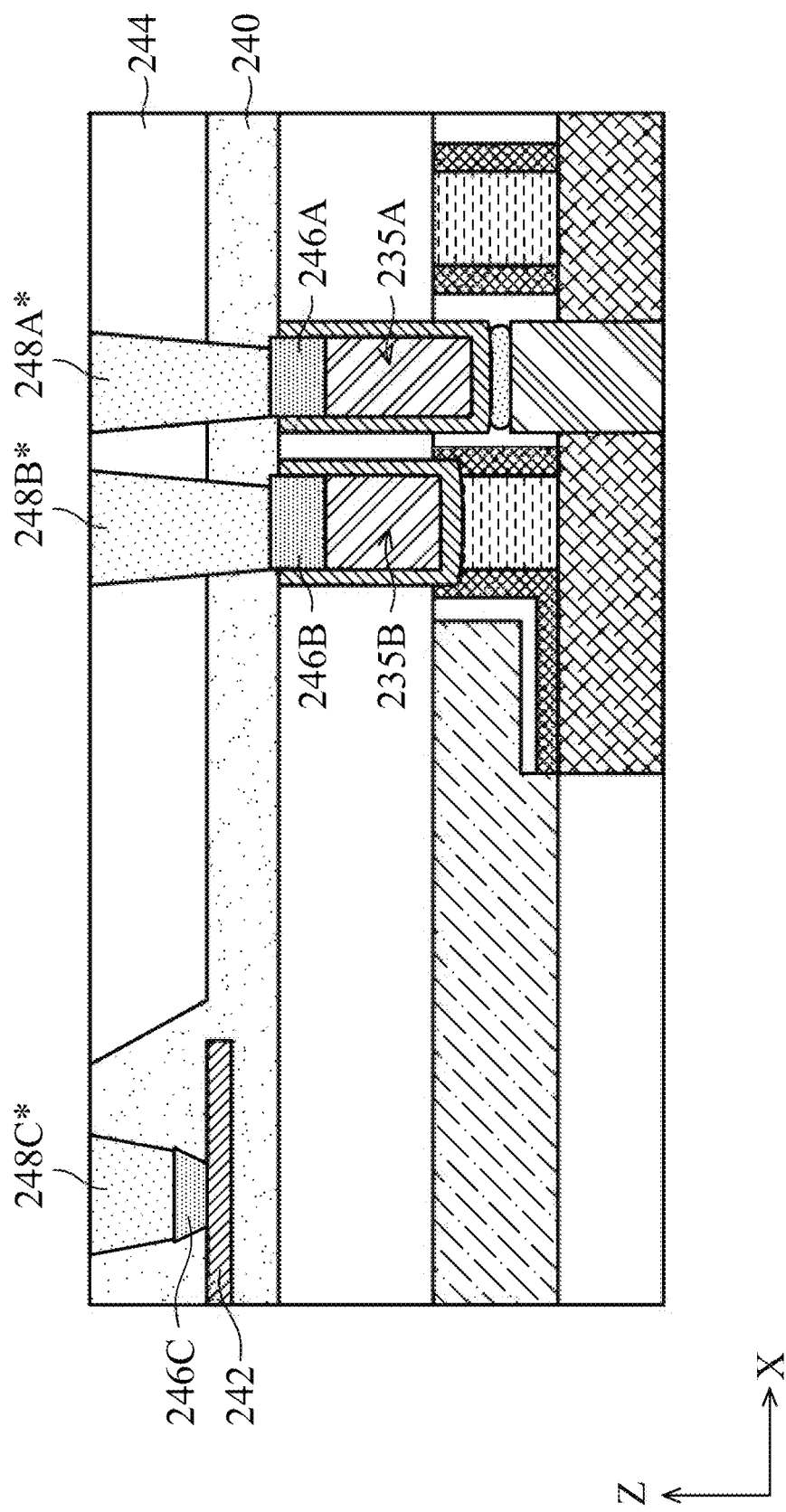
Figure 13:
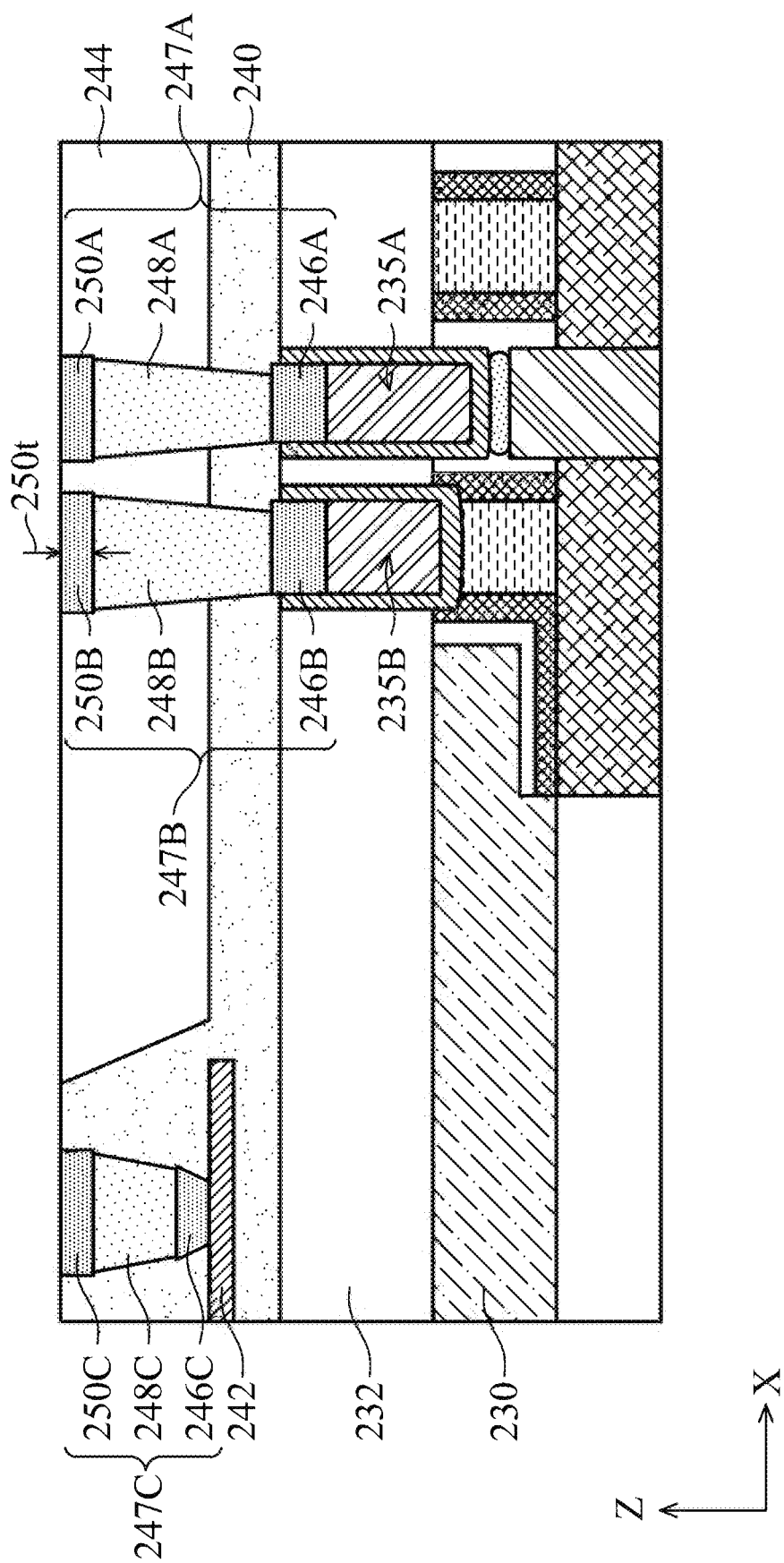

The CMP process following the selective bottom-up deposition process can be an ex-situ CMP process to substantially coplanarize top surfaces of the metal(s) deposited within via contact openings to form via contact plugs 248A*-248C* as shown in FIG. 12. Subsequently, via contact plugs 248A*-248C* can be etched back to form via contact plugs 248A-248C as shown in FIG. 13. In some embodiments, the etch back process can include a wet etch process that can include using a solution of de-ionized water (DI), $NH_4OH$, and $H_2O_2$ at a temperature ranging from about 20° C. to about 50° C. for a period ranging from about 3 seconds to about 120 seconds. In some embodiments, the wet etch process can etch back via contact plugs 248A-248C by a vertical dimension (e.g., thickness) along a Z-axis ranging from about 2 nm to about 4 nm.

Referring back to FIG. 3, in operation 350, top metal capping layers are formed on the via contact plugs. For example, as described with reference to FIG. 13, top metal capping layers 250A-250C can be formed on via contact plugs 248A-248C. The process for forming top metal capping layers 250A-250C can include sequential steps of: (i) thermal annealing via contact plugs 248A-248C in $H_2$; (ii) in-situ selectively bottom-up depositing the metal(s) for top metal capping layer 250A-250C; and (iii) chemical mechanical polishing (CMP) the deposited metal(s) (shown in FIG. 12).

The above discussion of $H_2$ thermal annealing prior to the formation of bottom metal capping layers 246A-246C and the in-situ selective bottom-up deposition of the metal(s) of bottom metal capping layers 246A-246C applies to top metal capping layer 250A-250C, unless mentioned otherwise. The $H_2$ thermal annealing process can remove surface oxides from top surfaces of via contact plugs 248A-248C to form substantially oxide-free (e.g., no oxide) top surfaces of via contact plugs 248A-248C selective bottom-up deposition of the metal(s) of top metal capping layer 250A-250C for subsequent formation of substantially void-free (e.g., no voids) top metal capping layers 250A-250C. The CMP process can substantially coplanarize top surfaces of the metal(s) deposited with top surfaces of ESL 240 and ILD 244 as shown in FIG. 13. Top metal capping layer 250A-250C can have vertical dimensions 250$t$ (e.g., thickness) along a Z-axis ranging from about 2 nm to about 4 nm.

Referring back to FIG. 3, in operation 360, interconnect structures are formed on the top metal capping layers. For example, as described with reference to FIGS. 2 and 13, interconnect structures 257A-257C can be formed on the structure of FIG. 13. Interconnect structures 257A-257C can include barrier layers 256 and conductive lines 258. The process for forming interconnect structures 257A-257C can include sequential steps of: (i) blanket depositing ESL 252; (ii) blanket depositing low-k layer 254 on ESL 252; (iii) forming interconnect openings (not shown); (iv) blanket depositing the material(s) for barrier layers 256; (v) blanket depositing the material(s) for conductive lines 258; and (vi) chemical mechanical polishing (CMP) the blanket deposited material(s) to form the structure of FIG. 2.

In some embodiments, ESL 252 can include aluminum oxide ($AlO_x$) deposited by ALD. In some embodiments, ESL 252 can be deposited by ALD using trimethylaluminum (TMA) and $H_2O$ as precursors at a temperature ranging from about 200° C. to about 350° C. In some embodiments, ESL 252 can have a vertical dimension (e.g., thickness) along a Z-axis ranging from about 3 nm to about 5 nm.

Low-k layer 254 can include low-k materials having a dielectric constant less than about 3.9) deposited by ALD. In some embodiments, low-k material can include SiOC, SiCN, SiOCN, SiOCH, porous $SiO_2$, and/or a combination thereof. In some embodiments, low-k layer 254 can have a vertical dimension (e.g., thickness) along a Z-axis ranging from about 50 nm to about 60 nm.

Interconnect openings can include etching of ESL 252 and low-k layer 254. A patterned photoresist layer and a hard mask layer can be formed on low-k layer 254. Portions of the hard mask layer not covered by the patterned photoresist layer can be etched to expose underlying low-k layer 254. The exposed low-k layer 254 can be etched to form interconnect openings followed by removal of the patterned photoresist layer and the hard mask layer. The portions of ESL 252 underlying the etched portions of low-k layer 254 can be etched to expose top metal capping layers 250A-250C.

In some embodiments, prior to the blanket deposition of barrier layers 256, a cleaning process using reactive $H_2$ ions/radicals can be performed on the interconnect openings to remove any residue (e.g., polymeric residue) from previous process steps (e.g., formation of interconnect openings). In some embodiments, the blanket deposition of barrier layers 256 can include depositing a first nitride layer (e.g., TaN layer) by ALD with a thickness ranging from about 0.5 nm to about 1.5 nm, a second nitride layer (e.g., TaN layer) by PVD with a thickness ranging from about 0.5 nm to about 1.5 nm, a metal liner (e.g., Co liner) by CVD with a thickness ranging from about 1 nm to about 3 nm, and a metal seed layer (e.g., Cu seed layer) by PVD with a thickness ranging from about 1 nm to about 2 nm. The first nitride layer can be blanket deposited by ALD using reaction gases, such as PDMAT and $NH_3$ as precursors at a temperature ranging from about 200° C. to about 350° C. The second nitride layer can be blanket deposited by PVD with Ta target and reaction gases, such as $NH_3$ at a temperature ranging from about 20° C. to about 40° C.

The blanket deposition of conductive lines 258 can include depositing conductive materials such as, W, Al, Co, or Cu using any suitable deposition process, such as PVD, CVD, ALD, molecular beam epitaxy (MBE), high density plasma CVD (HDPCVD), metal organic (MOCVD), remote plasma CVD (RPCVD), plasma-enhanced CVD (PECVD), electro-chemical plating (ECP), other suitable methods, and/ or combinations thereof. In some embodiment, the blanket deposition of conductive materials can include ECP Cu plating on barrier layers 256 to fill interconnect openings. In some embodiments, conductive lines 258 can have a horizontal dimension (e.g., width) along an X-axis ranging from about 20 nm to about 25 nm. In some embodiment, conductive lines 258 can have an aspect ratio ranging from about 2 to about 3, where the aspect ratio can be a ratio of their vertical dimensions (e.g., height) along a Z-axis to their horizontal dimensions (e.g., width) along an X-axis. The CMP process can substantially coplanarize top surfaces of low-k layer 254 and the blanket deposited materials for barrier layers 256 and conductive lines 258 to form interconnect structures 257A-257C, as shown in FIG. 2.

The present disclosure provides example structures and methods for reducing resistivity of via contact structures (e.g., via contact structures 247A-247C) of semiconductor devices (e.g., semiconductor device 100) using dual metal capping layers (e.g., bottom and top metal capping layers 246A-246C and 250A-250C). The dual metal capped via contact structures can be formed without barrier layers and can reduce the contact resistance interconnect structures and S/D contact structures, gate structures and high R structures from about 10% to about 30%, thus resulting in higher drive currents in the semiconductor devices with improved device performance. The top metal capping layers can also prevent electromigration of metals from interconnect structures to underlying structures to improve yield of the semiconductor devices.

The example structures and methods provide dual metal capped via contact structures 247A-247C with substantially void-free via contact plugs 248A-248C and bottom and top metal capping layers 246A-246C and 250A-250C. The substantially void-free dual metal capped via contact structures 247A-247C can be formed with low resistivity in via contact openings 962A-962C with dimensions (e.g., width or diameter) from about 10 nm to about 15 nm and with aspect ratio from about 5 to about 8.

In some embodiments, a method of fabricating a semiconductor device includes forming a fin structure on a substrate, forming a source/drain (S/D) region on the fin structure, forming a gate structure on the fin structure and adjacent to the S/D region, forming and S/D and gate contact structures on the S/D region and the gate structure, respectively. The forming of the S/D and gate contact structures includes forming S/D and gate contact plugs, respectively. The method further includes forming first and second via contact structures on the S/D and gate contact structures, respectively, and forming first and second interconnect structures on the first and second via contact structures, respectively. The forming of the first and second via contact structures includes forming a first via contact plug interposed between first top and bottom metal capping layers and a second via contact plug interposed between second top and bottom metal capping layers, respectively. The first and second via contact plugs have material compositions different from material compositions of the first and second top and bottom metal capping layers. The first and second interconnect structures have material compositions different from the material compositions of the first and second via contact structures.

In some embodiments, a method of fabricating a semiconductor device includes forming a transistor on a substrate, forming a passive device on the substrate and adjacent to the transistor, forming a contact structure on the transistor, forming first and second via contact structures on the contact structure and the passive device, respectively. The forming of the first and second via contact structures includes forming the first and second bottom metal capping layers on the contact structure and the passive device, respectively, forming the first and second via contact plugs on the first and second bottom metal capping layers, respectively, and forming the first and second top metal capping layers on the first and second via contact plugs, respectively.

In some embodiments, a semiconductor device includes a fin structure on a substrate, a source/drain (S/D) region disposed on the fin structure, a gate structure disposed on the fin structure and adjacent to the S/D region, S/D and gate contact structures disposed on the S/D region and the gate structure, respectively, first and second via contact structures disposed on the S/D and gate contact structures, respectively, and first and second interconnect structures disposed on the first and second via contact structures, respectively. The S/D and gate contact structures includes S/D and gate contact plugs, respectively. The first and second via contact structures includes a first via contact plug interposed between first top and bottom metal capping layers and a second via contact plug interposed between second top and bottom metal capping layers, respectively.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art can better understand the aspects of the present disclosure. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions, and alterations herein without departing from the spirit and scope of the present disclosure.

What is claimed is:

1. A method, comprising:
    forming a fin structure on a substrate;
    forming a dielectric layer above the fin structure;
    forming, on the fin structure, a via contact structure comprising a via contact plug interposed between a first metal capping layer and a second metal capping layer, wherein the via contact plug comprises a metal different from that of the first and second metal capping layers and wherein the metal is in direct contact with the dielectric layer; and forming an interconnect structure on the via contact structure.

2. The method of claim 1, wherein the forming the via contact structure comprises:
   forming the first metal capping layer on the fin structure;
   forming the via contact plug on the first metal capping layer; and
   forming the second metal capping layer on the via contact plug.

3. The method of claim 2, wherein the forming the via contact plug comprises:
   removing a surface oxide from a top surface of the first metal capping layer to form a substantially oxide-free top surface of the first metal capping layer; and
   depositing the metal of the via contact plug on the substantially oxide-free top surface of the first metal capping layer.

4. The method of claim 3, wherein the removing the surface oxide from the top surface of the first metal capping layer comprises performing an argon plasma etch on the top surface of the first metal capping layer.

5. The method of claim 2, wherein the forming the second metal capping layer comprises:
   etching back the via contact plug;
   removing a surface oxide from a top surface of the via contact plug to form a substantially oxide-free top surface of the via contact plug; and
   depositing a metal of the second metal capping layer on the substantially oxide-free top surface of the via contact plug.

6. The method of claim 5, wherein the removing the surface oxide from the top surface of the via contact plug comprises performing a thermal annealing process in hydrogen.

7. The method of claim 1, wherein the interconnect structure comprises an additional metal different from the metal of the via contact plug.

8. The method of claim 1, further comprising forming a source/drain (S/D) contact structure on the fin structure, wherein the S/D contract structure is in contact with the first metal capping layer.

9. The method of claim 1, further comprising forming a gate contact structure above the fin structure, wherein the gate contract structure is in contact with the first metal capping layer.

10. The method of claim 1, wherein the via contact plug comprises ruthenium, the first and second metal capping layers comprise tungsten, and the interconnect structure comprises copper.

11. A method, comprising:
   forming a transistor on a substrate, wherein the transistor comprises a source/drain region and a gate structure;
   forming a device contact structure on the S/D region or the gate structure;
   forming a via contact structure on the device contact structure, wherein the device contact structure comprises a via contact plug interposed between a first metal capping layer and a second metal capping layer, and wherein the via contact plug comprises a metal different from that of the first and second metal capping layers; and
   forming an interconnect structure on the via contact structure.

12. The method of claim 11, wherein the forming the via contact structure comprises:
   forming the first metal capping layer on the device contact structure;
   forming the via contact plug on the first metal capping layer; and
   forming the second metal capping layer on the via contact plug.

13. The method of claim 12, wherein the forming the via contact plug comprises:
   removing a surface oxide from a top surface of the first metal capping layer to form a substantially oxide-free top surface of the first metal capping layer; and
   depositing the metal of the via contact plug on the substantially oxide-free top surface of the first metal capping layer.

14. The method of claim 13, wherein the removing the surface oxide from the top surface of the first capping layer comprises performing an argon plasma etch on the top surface of the first metal capping layer.

15. The method of claim 11, further comprising:
   forming a passive device on the substrate and adjacent to the transistor;
   forming an additional via contact structure on the passive device, wherein the additional via contact structure comprises an additional via contact plug interposed between a third metal capping layer and a fourth metal capping layer, and wherein the additional via contact plug has a material composition different from that of the third and fourth metal capping layers; and
   forming an additional interconnect structure on the additional via contact structure.

16. A method, comprising:
   forming a fin structure on a substrate;
   forming a source/drain (S/D) region on the fin structure;
   forming an S/D contact structure on the S/D region;
   forming a dielectric layer on the S/D contact structure;
   forming a via contact structure within the dielectric layer and connected to the S/D contact structure, wherein:
      the via contact structure comprises a via contact plug interposed between a first metal capping layer and a second metal capping layer;
      the via contact plug comprises a first metal; and
      the first and second metal capping layers comprises a second metal different from the first metal; and
   forming an interconnect structure on the via contact structure.

17. The method of claim 16, wherein the forming the via contact structure comprises:
   forming the first metal capping layer on the S/D contact structure;
   forming the via contact plug on the first metal capping layer; and
   forming the second metal capping layer on the via contact plug.

18. The method of claim 17, wherein the forming the via contact plug comprises:
   removing a surface oxide from a top surface of the first metal capping layer to form a substantially oxide-free top surface of the first metal capping layer; and
   depositing the first metal of the via contact plug on the substantially oxide-free top surface of the first metal capping layer.

19. The method of claim 17, wherein forming the first metal capping layer comprises:
   forming a via contact opening in the dielectric layer;

removing a surface oxide from a top surface of the S/D contact structure to form a substantially oxide-free top surface of the S/D contact structure;

depositing the second metal on the substantially oxide-free top surface, wherein a deposition selectivity of the second metal is higher for the substantially oxide-free top surface than for sidewalls of the via contact opening.

20. The method of claim 17, wherein the forming the second metal capping layer comprises:

etching back the via contact plug;

removing a surface oxide from a top surface of the via contact plug to form a substantially oxide-free top surface of the via contact plug; and depositing the second metal of the second metal capping layer on the substantially oxide-free top surface of the via contact plug.

* * * * *